_(12)_ United States Patent
Lim et al.

(10) Patent No.: US 11,835,708 B2
(45) Date of Patent: Dec. 5, 2023

(54) LASER CRYSTALLIZATION APPARATUS

(71) Applicant: Samsung Display Co., LTD., Yongin-si (KR)

(72) Inventors: Dong Eon Lim, Cheonan-si (KR); Jeong Un Go, Cheonan-si (KR); Hyun Jin Kim, Ansan-si (KR); Hoon Chul Ryoo, Cheonan-si (KR); Yeong Jin Seol, Cheonan-si (KR); Gil Yong On, Anyang-si (KR); Yeon Hak Lee, Anyang-si (KR); Hye Ji Cho, Anyang-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 99 days.

(21) Appl. No.: 17/242,405

(22) Filed: Apr. 28, 2021

(65) Prior Publication Data

US 2021/0341727 A1    Nov. 4, 2021

(30) Foreign Application Priority Data

May 4, 2020  (KR) .................... 10-2020-0053130

(51) Int. Cl.
*G02B 26/02* (2006.01)
*H01L 27/12* (2006.01)
*G02B 27/14* (2006.01)
*G02B 19/00* (2006.01)

(52) U.S. Cl.
CPC ....... *G02B 26/023* (2013.01); *G02B 19/0014* (2013.01); *G02B 27/144* (2013.01); *H01L 27/1285* (2013.01)

(58) Field of Classification Search
CPC ............. G02B 26/023; G02B 19/0014; G02B 27/144; H01L 27/1285
USPC .......................................................... 359/601
See application file for complete search history.

(56) References Cited

FOREIGN PATENT DOCUMENTS

| KR | 100814821 | | 3/2008 |
|---|---|---|---|
| KR | 20120062474 A | * | 6/2012 |
| KR | 1020120062474 | | 6/2012 |

\* cited by examiner

*Primary Examiner* — Wyatt A Stoffa
*Assistant Examiner* — Mitchell T Oestreich
(74) *Attorney, Agent, or Firm* — CANTOR COLBURN LLP

(57) ABSTRACT

A laser crystallization apparatus includes a plurality of laser generators which generate a plurality of laser beams, a plurality of attenuators which adjust energy intensity of the plurality of laser generators, and an optical module which overlap outputs of the plurality of attenuators to output a line beam. A first attenuator of the plurality of attenuators attenuates the energy intensity of the corresponding laser beam, and a second attenuator of the plurality of attenuators maintains the energy intensity of the corresponding laser beam.

20 Claims, 17 Drawing Sheets

LASER CRYSTALLIZATION APPARATUS

This application claims priority to Korean Patent Application No. 10-2020-0053130 filed on May 4, 2020, and all the benefits accruing therefrom under 35 U.S.C. § 119, the content of which in its entirety is herein incorporated by reference.

BACKGROUND

1. Field

Embodiments of the invention relate to a laser crystallization apparatus.

2. Description of the Related Art

A thin film transistor is used as a switching element of a display device such as a liquid crystal display device or an organic light emitting device. The thin film transistor may include a gate electrode, an active layer, a source electrode, and a drain electrode. The active layer may include amorphous silicon or polysilicon. Polysilicon has tens to hundreds of times higher electric mobility characteristics than that of amorphous silicon.

Polysilicon may be formed by depositing amorphous silicon and then crystallizing the amorphous silicon. Amorphous silicon may be crystallized into polysilicon by heating the amorphous silicon in a hot furnace or irradiating the amorphous silicon with a laser. In the crystallization method using the laser, crystallization may be performed at a relatively low temperature for a relatively short time.

SUMMARY

Advantages and features of the invention are to provide a laser crystallization apparatus capable of improving crystallization margin and crystallization uniformity by reducing the long axis angular distribution of a line beam.

However, advantages and features of the invention are not restricted to the one set forth herein. The above and other advantage and features of the invention will become more apparent to one of ordinary skill in the art to which the invention pertains by referencing the detailed description of the invention given below.

In an embodiment of the invention, a laser crystallization apparatus includes a plurality of laser generators which generate a plurality of laser beams, a plurality of attenuators which adjust energy intensity of the plurality of laser beams, and an optical module which overlaps outputs of the plurality of attenuators and outputs a line beam. A first attenuator of the plurality of attenuators attenuates the energy intensity of a corresponding laser beam of the plurality of laser beams, and a second attenuator of the plurality of attenuators maintains the energy intensity of the corresponding laser beam.

In an embodiment, the first attenuator may include a first attenuation unit and a second attenuation unit which transmit and reflect the laser beam, and the second attenuator may include a first plate and a second plate which maintain the energy intensity of the laser beam.

In an embodiment, the first attenuation unit may be inclined at a predetermined angle from a traveling direction of the laser beam, and the second attenuation unit may be inclined at a predetermined angle in a direction opposite to the first attenuation unit from the traveling direction of the laser beam.

In an embodiment, the first attenuator may further include a first base unit which supports the first attenuation unit, a second base unit which supports the second attenuation unit, and a control unit which is connected to each of the first and second base units and rotates the first and second base units in a first rotation direction or a second rotation direction opposite to the first rotation direction.

In an embodiment, the first and second plates of the second attenuator may be arranged in parallel to the traveling direction of the corresponding laser beam, and may be spaced apart from a path of the laser beam by a predetermined distance.

In an embodiment, the second attenuator may further include a first base unit which supports the first plate, and a second base unit which supports the second plate. The first and second base units of the second attenuator may be fixed such that the first and second plates are spaced apart from the laser beam.

In an embodiment, the plurality of laser generators may generate laser beams having identical energy intensity.

In an embodiment, the optical module may include at least one mirror reflecting an entirety of the laser beam, at least one splitter which reflects a part of the laser beam and transmits another part of the laser beam, and a telescope lens which magnifies the laser beam which is reflected by the at least one mirror or passes the at least one splitter.

In an embodiment, the optical module may further include a homogenizer which equalizes the laser beams which pass through the telescope lens, and a plurality of cylindrical lenses which adjust intensity and focus of laser beams which pass through the homogenizer to output a line beam.

In an embodiment, the plurality of laser generators may include first to sixth laser generators, the plurality of attenuators may include first to sixth attenuators corresponding to each of the first to sixth laser generators, and the first and sixth attenuators may attenuate the energy intensity of the corresponding laser beam, and the second to fifth attenuators may maintain the energy intensity of the corresponding laser beam.

In an embodiment, each of the first and sixth attenuators may include a first attenuation unit and a second attenuation unit which transmit and reflect the laser beam, and each of the second to fifth attenuators may include a first plate and second plate which maintain energy intensity of the laser beam.

In an embodiment, the first attenuation unit may be inclined at a predetermined angle from a traveling direction of the laser beam, and the second attenuation unit may be inclined at a predetermined angle in a direction opposite to the first attenuation unit from the traveling direction of the laser beam.

In an embodiment, each of the first and second attenuators may further include a first base unit which supports the first attenuation unit, a second base unit which supports the second attenuation unit, and a control unit which is connected to the first and second base units and rotates the first and second base units in a first rotation direction or a second rotation direction opposite to the first rotation direction.

In an embodiment, the first and second plates may be arranged in parallel to the traveling direction of the corresponding laser beam, and may be spaced apart from a path of the laser beam by a predetermined distance.

In an embodiment, each of the second to fifth attenuators may further include a first base unit which supports the first plate, and a second base unit which supports the second plate. The first and second base units of each of the second to fifth attenuators may be fixed such that the first and second plates are spaced apart from the laser beam.

In an embodiment, the plurality of laser generators may include first to fourth laser generators, the plurality of attenuators may include first to fourth attenuators corresponding to each of the first to fourth laser generators, and the first and fourth attenuators may attenuate the energy intensity of the corresponding laser beam, and the second and third attenuators may maintain the energy intensity of the corresponding laser beam.

In an embodiment, each of the first and fourth attenuators may include a first attenuation unit and a second attenuation unit which transmit and reflect the laser beam, and each of the second and third attenuators may include a first plate and second plate which maintain energy intensity of the laser beam.

In an embodiment, the first attenuation unit may be inclined at a predetermined angle from a traveling direction of the laser beam, and the second attenuation unit may be inclined at a predetermined angle in a direction opposite to the first attenuation unit from the traveling direction of the laser beam.

In an embodiment, each of the first and fourth attenuators may further include a first base unit which supports the first attenuation unit, a second base unit which supports the second attenuation unit, and a control unit which is connected to the first and second base units and rotates the first and second base units in a first rotation direction or a second rotation direction opposite to the first rotation direction.

In an embodiment, the first and second plates of each of the second and third attenuators may be arranged in parallel to the traveling direction of the corresponding laser beam, and may be spaced apart from a path of the laser beam by a predetermined distance.

BRIEF DESCRIPTION OF THE DRAWINGS

The above and other embodiments, advantages and features of the invention will become more apparent by describing in detail embodiments thereof with reference to the attached drawings, in which.

DETAILED DESCRIPTION

Figure 1:
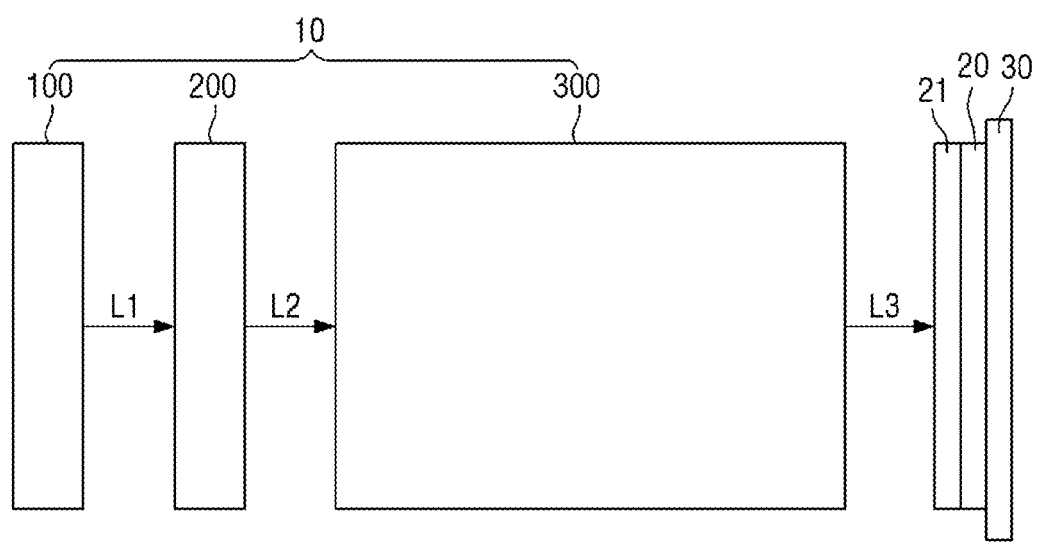
FIG. 1 is a view of an embodiment of a laser crystallization apparatus.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. Specific shapes, configurations, and characteristics of an embodiment may be used or implemented in another embodiment without departing from the inventive concepts, for example.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. Two consecutively described processes may be performed substantially at the same time or performed in an order opposite to the described order, for example. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. The X-axis, the Y-axis, and the Z-axis may be perpendicular to one another, or may represent different directions that are not perpendicular to one another, for example. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. If the apparatus in the drawings is turned over, elements described as "below" or "beneath" other elements or features would then be oriented "above" the other elements or features, for example. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to cross-sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
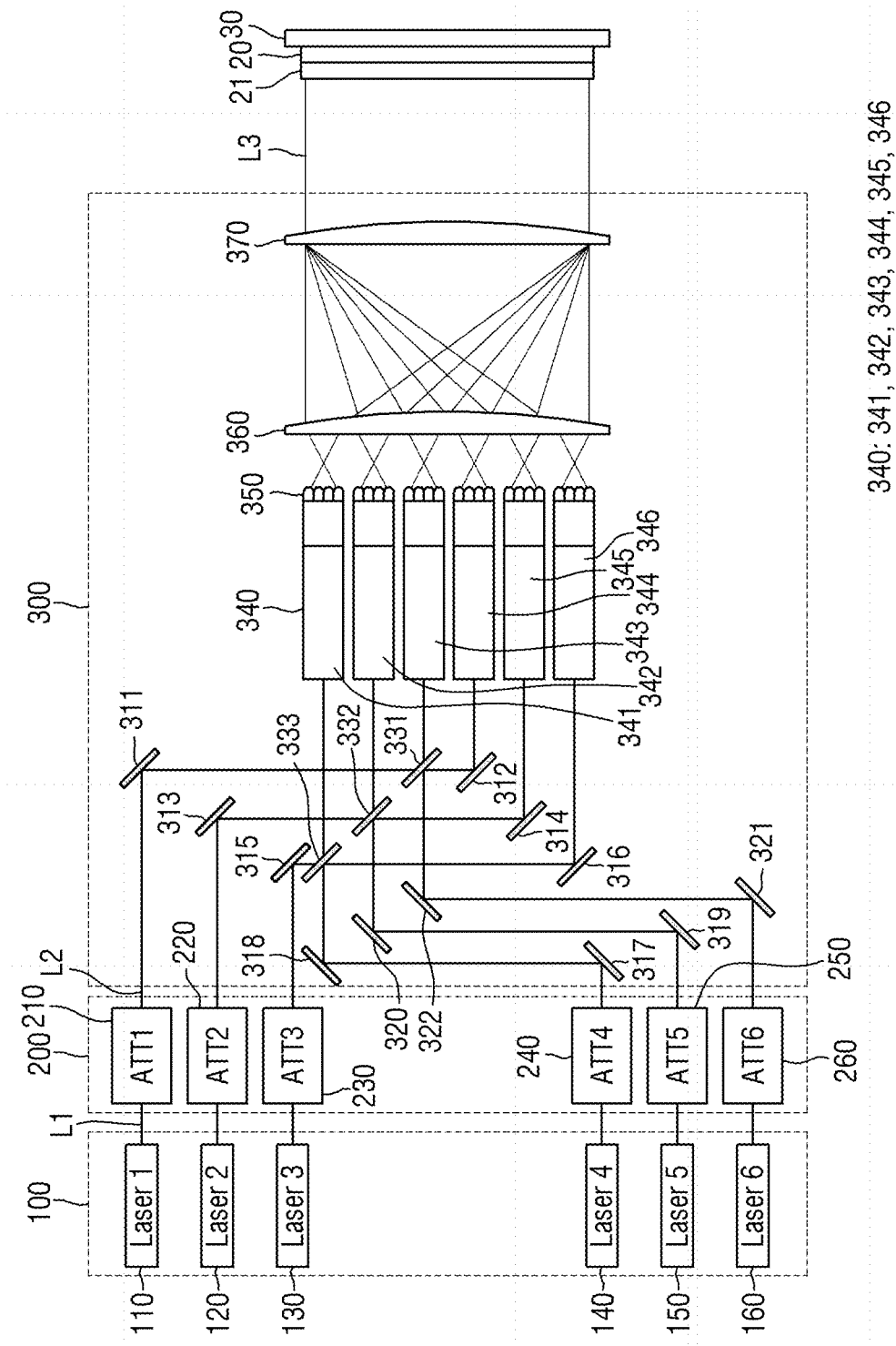
FIG. 2 is a view of an embodiment of the laser crystallization apparatus.

FIG. 1 is a view of an embodiment of a laser crystallization apparatus, and FIG. 2 is a view of an embodiment of a laser crystallization apparatus.

Referring to FIGS. 1 and 2, a laser crystallization apparatus 10 includes a plurality of laser generators 100, a plurality of attenuators 200, and an optical module 300.

Each of the plurality of laser generators 100 may generate a first laser beam L1 and supply the first laser beam L1 to the corresponding attenuator of the plurality of attenuators 200. In an embodiment, the laser generator 100 may include a laser oscillator and a window, for example. The laser oscillator may generate the first laser beam L1, and the first laser beam L1 may pass through to the window to be supplied to the attenuator 200. Each of the plurality of laser generators 100 may generate the first laser beam L1 having the same energy size or the same energy density.

In an embodiment, the first laser beam L1 generated from the laser generator 100 may have a wavelength of about 300 nanometers (nm) to about 550 nm, for example, but the invention is not limited thereto. In an embodiment, the first laser beam L1 generated from the laser generator 100 may include P-polarized light and S-polarized light, for example.

Each of the plurality of attenuators 200 may adjust the energy intensity of the first laser beam L1 generated by the corresponding laser generator 100 to obtain a second laser beam L2, and may supply the second laser beam L2 to optical module 300. Some of the plurality of attenuators 200 may attenuate the energy intensity of the corresponding first laser beam L1, and others of the plurality of attenuators 200 may maintain the energy intensity of the corresponding first laser beam L1. In an embodiment, some attenuators 200 may reduce the P-polarized light and S-polarized light of the corresponding first laser beam L1, respectively, to output the second laser beam L2, for example. Other attenuators 200 may maintain the P-polarized light and S-polarized light of the corresponding first laser beam L1, respectively, to output the second laser beam L2.

The plurality of laser generators 100 may include first to sixth laser generators 110 to 160, and the plurality of attenuators 200 may include first to sixth attenuators 210 to 260. The first to sixth laser generators 110 to 160 may correspond to the first to sixth attenuators 210 to 260, respectively, and may supply the laser beams L1 to the first to sixth attenuators 210 to 260, respectively. Each of the first to sixth attenuators 210 to 260 may attenuate or maintain the energy intensity of the first laser beam L1 to supply the second laser beam L2 to the optical module 300.

The optical module 300 may output a line beam L3 by overlapping the second laser beams L2 output from the plurality of attenuators 200, and may supply the line beam L3 to a thin film 21 disposed on a substrate 20. Here, the substrate 20 on which the thin film 21 is disposed may be disposed (e.g., mounted) on a stage 30 and supported and fixed by the stage 30 while a laser crystallization process is performed by the laser crystallization apparatus 10. The thin film 21 may be an amorphous silicon layer. In an embodiment, the amorphous silicon layer may be provided by a low-pressure chemical vapor deposition method, an atmospheric-pressure chemical vapor deposition method, a plasma enhanced chemical vapor deposition ("PECVD") method, a sputtering method, or a vacuum evaporation method. The line beam L3 may crystallize amorphous silicon on the substrate 20, for example.

The optical module 300 may include at least one mirror and at least one splitter. The mirror may reflect an entirety of the second laser beam L2. The splitter may reflect a part of the second laser beam L2 and transmit the other part of the second laser beam L2. In an embodiment, the splitter may reflect a part of the P-polarized light of the second laser beam L2 and transmit the other part of the P-polarized light thereof, and may reflect a part of the S-polarized light of the second laser beam L2 and transmit the other part of the S-polarized light thereof, for example.

The optical module 300 may further include a telescope lens 340. The telescope lens 340 may magnify the second laser beam L2 which passes through at least one mirror and at least one splitter. The telescope lens 340 may magnify the second laser beam L2 to a predetermined intensity and supply it to a homogenizer 350.

The optical module 300 may include first to twelfth mirrors 311 to 322, first to third splitters 331 to 333, a telescope lens 340, a homogenizer 350, and a first cylindrical lens 360, and a second cylindrical lens 370. The telescope lens 340 may include first to sixth telescope lenses 341 to 346.

The first mirror 311 may reflect the second laser beam L2 output from the first attenuator 210 and supply it to the first splitter 331, and the first splitter 331 may reflect a part of the second laser beam L2 supplied from the first mirror 311 and supply it to the third telescope lens 343 and may transmit another part of the second laser beam L2 and supply it to the second mirror 312. The second mirror 312 may reflect another part of the second laser beam L2 supplied from the first splitter 331 and supply it to the fourth telescope lens 344.

The third mirror 313 may reflect the second laser beam L2 output from the second attenuator 220 and supply it to the second splitter 332, and the second splitter 332 may reflect a part of the second laser beam L2 supplied from the third mirror 313 and supply it to the second telescope lens 342 and may transmit another part of the second laser beam L2 and supply it to the fourth mirror 314. The fourth mirror 314 may reflect another part of the second laser beam L2 supplied from the second splitter 332 and supply it to the fifth telescope lens 345.

The fifth mirror 315 may reflect the second laser beam L2 output from the third attenuator 230 and supply it to the third splitter 333, and the third splitter 333 may reflect a part of the second laser beam L2 supplied from the fifth mirror 315 and supply it to the first telescope lens 341 and may transmit another part of the second laser beam L2 and supply it to the sixth mirror 316. The sixth mirror 316 may reflect another part of the second laser beam L2 supplied from the third splitter 333 and supply it to the sixth telescope lens 346.

The seventh mirror 317 may reflect the second laser beam L2 output from the fourth attenuator 240 and supply it to the eighth mirror 318, and the eighth mirror 318 may reflect the second laser beam L2 and supply it to the third splitter 333. The third splitter 333 may transmit a part of the second laser beam L2 supplied from the eighth mirror 318 and supply it to the first telescope lens 341, and may reflect another part of the second laser beam L2 and supply it to the sixth mirror 316. The sixth mirror 316 may reflect another part of the second laser beam L2 supplied from the third splitter 333 and supply it to the sixth telescope lens 346. Accordingly, the third splitter 333 may overlap a part of the second laser beam L2 of the third attenuator 230 with a part of the second laser beam L2 of the fourth attenuator 240 and supply it to the first telescope lens 341. Further, the third splitter 333 may overlap another part of the second laser beam L2 of the third attenuator 230 with another part of the second laser beam L2 of the fourth attenuator 240 and supply it to the sixth telescope lens 346.

The ninth mirror 319 may reflect the second laser beam L2 output from the fifth attenuator 250 and supply it to the tenth mirror 320, and the tenth mirror 320 may reflect the second laser beam L2 and supply it to the second splitter 332. The second splitter 332 may transmit a part of the second laser beam L2 supplied from the tenth mirror 320 and supply it to the second telescope lens 342, and may reflect another part of the second laser beam L2 and supply it to the forth mirror 314. The forth mirror 314 may reflect another part of the second laser beam L2 supplied from the second splitter 332 and supply it to the fifth telescope lens 345. Accordingly, the second splitter 332 may overlap a part of the second laser beam L2 of the second attenuator 220 with a part of the second laser beam L2 of the fifth attenuator 250 and supply it to the second telescope lens 342. Further, the second splitter 332 may overlap another part of the second laser beam L2 of the second attenuator 220 with another part of the second laser beam L2 of the fifth attenuator 250 and supply it to the fifth telescope lens 345.

The eleventh mirror 321 may reflect the second laser beam L2 output from the sixth attenuator 260 and supply it to the twelfth mirror 322, and the twelfth mirror 322 may reflect the second laser beam L2 and supply it to the first splitter 331. The first splitter 331 may transmit a part of the second laser beam L2 supplied from the twelfth mirror 322 and supply it to the third telescope lens 343, and may reflect another part of the second laser beam L2 and supply it to the second mirror 312. The second mirror 312 may reflect another part of the second laser beam L2 supplied from the first splitter 331 and supply it to the fourth telescope lens 344. Accordingly, the first splitter 331 may overlap a part of the second laser beam L2 of the first attenuator 210 with a part of the second laser beam L2 of the sixth attenuator 260 and supply it to the third telescope lens 343. Further, the first splitter 331 may overlap another part of the second laser beam L2 of the first attenuator 210 with another part of the second laser beam L2 of the sixth attenuator 260 and supply it to the fourth telescope lens 344.

Accordingly, the first to twelfth mirrors 311 to 322, the first to third splitters 331 to 333, and the first to sixth telescopes 341 to 346 may overlap the plurality of second laser beams L2 output from the first to sixth attenuators 210 to 260 and supply it to the homogenizer 350.

The homogenizer 350 may equalize the plurality of second laser beams L2 output from the first to sixth telescopes 341 to 346 to evenly distribute the energy density of the laser beams.

The first cylindrical lens 360 may adjust the intensity and focus of the second laser beam L2 output from the homogenizer 350 and supply it to the second cylindrical lens 370, and the second cylindrical lens 370 may adjust the intensity and focus of the second laser beam L2 output from the first cylindrical lens 360 and output a line beam L3. The line beam L3 output from the optical module 300 may correspond to a linear laser beam.

Hereinafter, the configuration of the optical module 300 is not limited to the illustration of FIG. 2. When necessary, the design of the optical module 300 may be changed in order to generate a predetermined line beam L3 by receiving the second laser beams L2 output from the plurality of attenuators 200.

Figure 3:
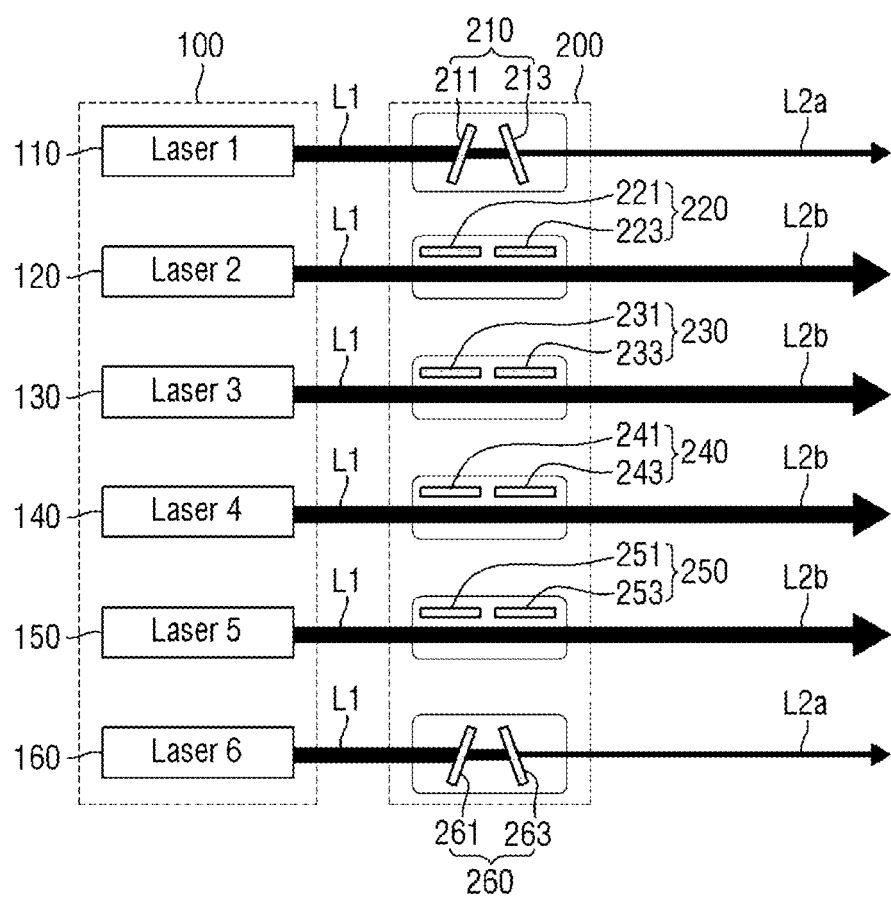
FIG. 3 is a view showing an embodiment of a laser generator and an attenuator of the laser crystallization apparatus.

FIG. 3 is a view showing an embodiment of a laser generator and an attenuator of the laser crystallization apparatus.

Referring to FIG. 3, the plurality of laser generators 100 may include first to sixth laser generators 110 to 160, and the plurality of attenuators 200 may include first to sixth attenuators 210 to 260. The first to sixth laser generators 110 to 160 may correspond to the first to sixth attenuators 210 to 260, respectively, and may supply laser beams L1 to the first to sixth attenuators 210 to 260, respectively. Each of the first to sixth attenuators 210 to 260 may attenuate or maintain the energy intensity of the first laser beam L1 to supply the second laser beam L2 to the optical module 300.

The first attenuator 210 may attenuate the energy intensity of the first laser beam L1 of the first laser generator 110 to supply a second laser beam L2a to the optical module 300. The first attenuator 210 may attenuate the energy intensity of each of the P-polarized light and S-polarized light of the first laser beam L1 to output a second laser beam L2a. The energy intensity of the second laser beam L2a may be smaller than the energy intensity of the first laser beam L1.

The first attenuator 210 may include a first attenuation unit 211 and a second attenuation unit 213. The first and second attenuation units 211 and 213 may be arranged in parallel along the traveling direction of the first laser beam L1, and may transmit and reflect the first laser beam L1. The first attenuation unit 211 may be inclined at a predetermined angle from the traveling direction of the first laser beam L1. The first attenuation unit 211 may transmit a part of the first laser beam L1 and reflect another part of the first laser beam L1. The transmittance and reflectance of the first attenuation unit 211 may be controlled depending on the incident angle of the first laser beam L1. One surface of the first attenuation unit 211 is inclined at a predetermined angle from the traveling direction of the first laser beam L1, thereby controlling the amount of transmission of the first laser beam L1. In an embodiment, the energy intensity of the first laser beam L1 transmitting the first attenuation unit 211 when the incident angle of the first laser beam L1 is small may be greater than the energy intensity of the first laser beam L1 transmitting the first attenuation unit 211 when the incident angle of the first laser beam L1 is great, for example. The output of the first attenuation unit 211 may be supplied to the second attenuation unit 213.

The second attenuation unit 213 may compensate for a path of the laser beam output from the first attenuation unit 211. The second attenuation unit 213 may be inclined at a predetermined angle in a direction opposite to the first attenuation unit 211 from the traveling direction of the first laser beam L1. The inclination of the second attenuation unit 213 may be changed in response to a change in the inclination of the first attenuation unit 211. In an embodiment, the incident angle of the first laser beam L1 incident on the first attenuation unit 211 may correspond to the incident angle of the output of the first attenuation unit 211 incident on the second attenuation unit 213, for example. Accordingly, the second attenuation unit 213 may compensate for the path of the laser beam output from the first attenuation unit 211, so that the second laser beam L2a output from the second attenuation unit 213 may maintain the traveling direction of the first laser beam L1 incident on the first attenuation unit 211.

The second attenuator 220 may maintain the energy intensity of the first laser beam L1 of the second laser generator 120 to supply a second laser beam L2b to the optical module 300. The second attenuator 220 may maintain the energy intensity of each of the P-polarized light and S-polarized light of the first laser beam L1 to output the second laser beam L2b.

The second attenuator 220 may include a first plate 221 and a second plate 223. The first and second plates 221 and 223 may be arranged in parallel along the traveling direction of the first laser beam L1, and may pass the first laser beam L1 as it is. Each of the first and second plates 221 and 223 may be spaced apart from the path of the first laser beam L1 by a predetermined distance. The first laser beam L1 may not pass through the first and second plates 221 and 223, and may maintain the existing energy intensity. Accordingly, the energy intensity of the second laser beam L2b, which is an output of the second attenuator 220, may be substantially the same as the energy intensity of the first laser beam L1, which is an input of the second attenuator 220.

The third attenuator 230 may include a first plate 231 and a second plate 233, the fourth attenuator 240 may include a first plate 241 and a second plate 243, and the fifth attenuator 250 may include a first plate 251 and a second plate 253. The third to fifth attenuators 230, 240, and 250 merely differ from the second attenuator 220 in the corresponding laser generator 100, and may have the same configuration as the second attenuator 220. Accordingly, each of the third to fifth attenuators 230, 240, and 250 maintains the energy intensity of the first laser beam L1 of each of the third to fifth laser generators 130, 140, and 150 to supply the second laser beam L2b to the optical module 300. The energy intensity of the second laser beam L2b, which is an output of each of the third to fifth attenuators 230, 240, and 250 may be substantially the same as the energy intensity of the first laser beam L1.

The sixth attenuator 260 may include a first attenuation unit 261 and a second attenuation unit 263. The first and sixth attenuators 210 and 260 merely differ from each other in the corresponding laser generator 100, and may have the same configuration as each other. Accordingly, the first and second attenuation units 261 and 263 of the sixth attenuator 260 may reduce the energy intensity of the first laser beam L1 of the sixth laser generator 160 to supply the second laser beam L2a to the optical module 300.

In an embodiment, when the second laser beam L2 of each of the first and sixth attenuators 210 and 260 is output from the outermost of the optical module 300, each of the first and sixth attenuators 210 and 260 may attenuate the energy intensity of the corresponding first laser beam L1, for example. Further, when the second laser beam L2 of each of the second to fifth attenuators 220 to 250 is output from an area excluding the outermost of the optical module 300, each of the second to fifth attenuators 220 to 250 may maintain the energy intensity of the corresponding first laser beam L1. Accordingly, each of the first and sixth attenuators 210 and 260 may output the second laser beam L2a having reduced energy intensity, and each of the second to fifth attenuators 220 to 250 may output the second laser beam L2b having maintained energy intensity.

Figure 4:
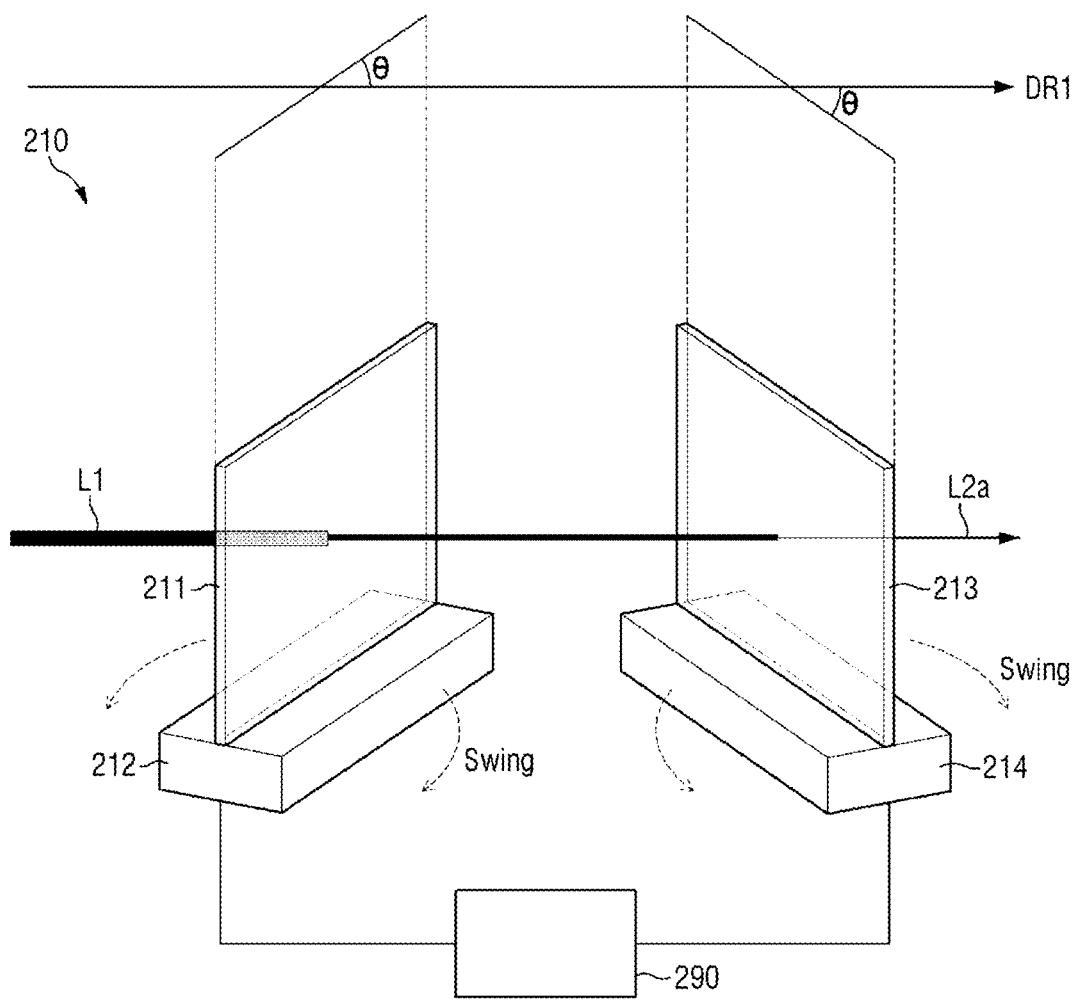
FIG. 4 is a view showing an embodiment of a first attenuator in the laser crystallization apparatus.

FIG. 4 is a view showing an embodiment of a first attenuator in the laser crystallization apparatus.

Referring to FIG. 4, the first attenuator 210 may attenuate the energy intensity of the first laser beam L1 of the first laser generator 110 to supply the second laser beam L2a to the optical module 300. The energy intensity of the second laser beam L2a may be smaller than the energy intensity of the first laser beam L1.

The first attenuator 210 may include a first attenuation unit 211, a first base unit 212, a second attenuation unit 213, a second base unit 214, and a control unit 290. The first and second attenuation units 211 and 213 may be arranged in parallel along the traveling direction DR1 of the first laser beam L1, and may transmit and reflect the first laser beam L1.

The first attenuation unit 211 may be inclined at a predetermined angle θ from the traveling direction DR1 of the first laser beam L1. The first attenuation unit 211 may transmit a part of the first laser beam L1 and reflect another part of the first laser beam L1. The transmittance and reflectance of the first attenuation unit 211 may be controlled depending on the incident angle of the first laser beam L1. One surface of the first attenuation unit 211 is inclined at a predetermined angle θ from the traveling direction DR1 of the first laser beam L1, thereby controlling the amount of transmission of the first laser beam L1. In an embodiment, the energy intensity of the first laser beam L1 transmitting the first attenuation unit 211 when the incident angle of the first laser beam L1 is small may be greater than the energy intensity of the first laser beam L1 transmitting the first attenuation unit 211 when the incident angle of the first laser beam L1 is great, for example. The output of the first attenuation unit 211 may be supplied to the second attenuation unit 213.

The first base unit 212 may support the first attenuation unit 211 and may rotate in a first rotation direction or a second rotation direction by the control unit 290. In an embodiment, the first rotation direction may correspond to a clockwise direction, and the second rotation direction may correspond to a counterclockwise direction, for example, but the invention is not limited thereto. Accordingly, the first base unit 212 may determine the inclination of the first attenuation unit 211 with respect to the traveling direction DR1 of the first laser beam L1.

The second attenuation unit 213 may compensate for a path of the laser beam output from the first attenuation unit 211. The second attenuation unit 213 may be inclined at a predetermined angle θ in a direction opposite to the first attenuation unit 211 from the traveling direction of the first laser beam L1. Accordingly, the second attenuation unit 213 may compensate for the path of the laser beam output from the first attenuation unit 211, so that the second laser beam L2a output from the second attenuation unit 213 may maintain the traveling direction DR1 of the first laser beam L1 incident on the first attenuation unit 211.

The second base unit 214 may support the second attenuation unit 213 and may rotate in the first rotation direction or the second rotation direction by the control unit 290. Accordingly, the second base unit 214 may determine the inclination of the second attenuation unit 213 with respect to the traveling direction DR1 of the laser beam output from the first attenuation unit 211. The inclination of the second attenuation unit 213 may be changed in response to a change in the inclination of the first attenuation unit 211. In an embodiment, the incident angle of the first laser beam L1 incident on the first attenuation unit 211 may correspond to the incident angle of the output of the first attenuation unit 211 incident on the second attenuation unit 213, for example.

The control unit 290 may be connected to each of the first and second base units 212 and 214 to rotate the first and second base units 212 and 214 in the first rotation direction or the second rotation direction. In an embodiment, the control unit 290 may reduce the incident angle of the first laser beam L1 to the first attenuation unit 211 by rotating the first base unit 212, and may reduce the amount of attenuation of the energy intensity, for example. In another embodiment, the control unit 290 may increase the incident angle of the first laser beam L1 to the first attenuation unit 211 by rotating the first base unit 212, and may increase the amount of attenuation of the energy intensity, for example. Accordingly, the control unit 290 may adjust the inclinations of the first and second base units 212 and 214 in a plurality of operations, and may select an optimal energy section of the line beam L3 output from the optical module 300.

Referring to FIG. 3 together with FIG. 4, the sixth attenuator 260 may have the same configuration as the first attenuator 210. Therefore, a description of the sixth attenuator 260 is replaced with the description of the first attenuator 210.

Figure 5:
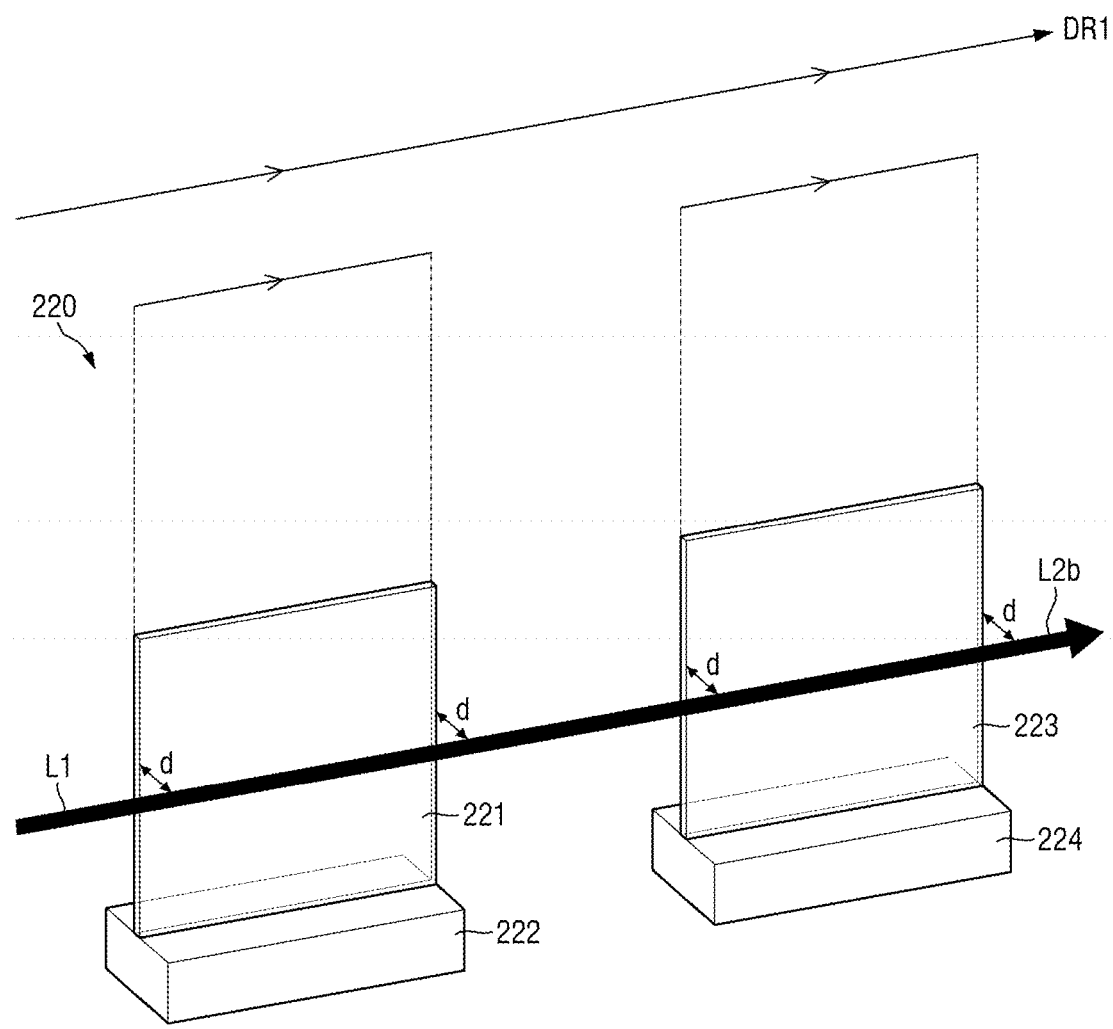
FIG. 5 is a view showing an embodiment of a second attenuator in the laser crystallization apparatus.

FIG. 5 is a view showing an embodiment of a second attenuator in the laser crystallization apparatus.

Referring to FIG. 5, the second attenuator 220 may maintain the energy intensity of the first laser beam L1 of the second laser generator 120 to supply the second laser beam L2b to the optical module 300.

The second attenuator 220 may include a first plate 221, a first base unit 222, a second plate 223, and a second base unit 224. The first and second plates 221 and 223 may be arranged in parallel along the traveling direction of the first laser beam L1, and may pass the first laser beam L1 as it is. Each of the first and second plates 221 and 223 may be spaced apart from the path of the first laser beam L1 by a predetermined distance d. The first laser beam L1 may not pass through the first and second plates 221 and 223, and may maintain the existing energy intensity. Accordingly, the energy intensity of the second laser beam L2b, which is an output of the second attenuator 220, may be substantially the same as the energy intensity of the first laser beam L1, which is an input of the second attenuator 220.

The first base unit 222 of the second attenuator 220 may support the first plate 221, and the second base unit 224 thereof may support the second plate 223. The first base unit 222 of the second attenuator 220 may fix the first plate 221 such that the first plate 221 is spaced apart from the first laser beam L1, and the second base unit 224 thereof may fix the second plate 223 such that the second plate 223 is spaced apart from the first laser beam L1.

Figure 6:
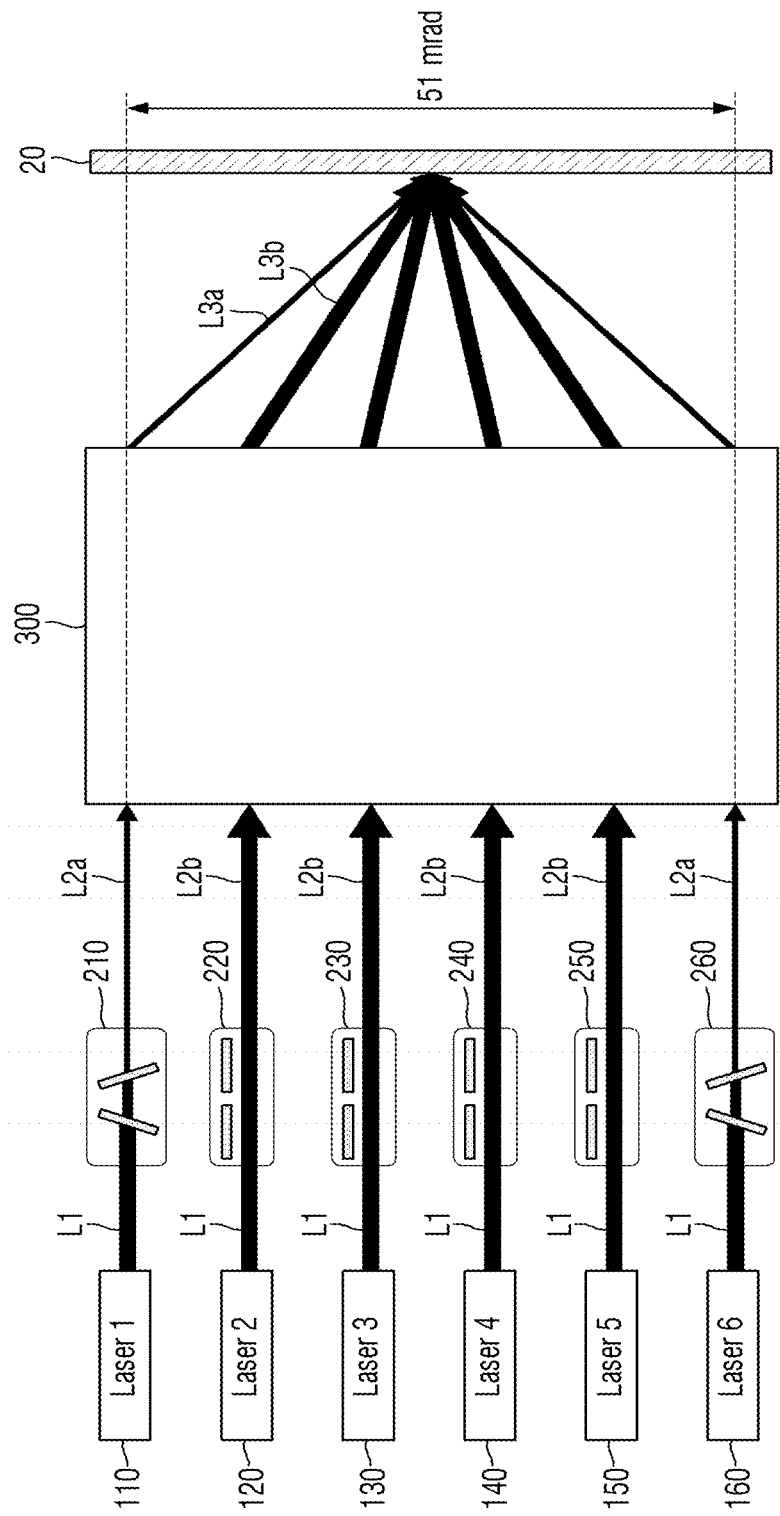
FIG. 6 is a view showing an embodiment of an output of the laser crystallization apparatus.

FIG. 6 is a view showing an embodiment of an output of the laser crystallization apparatus. Here, the laser crystallization apparatus 10 (refer to FIG. 1) of FIG. 6 may include the first to sixth attenuators 210 to 260 shown in FIGS. 3 to 5.

Referring to FIG. 6, the plurality of laser generators 100 may include first to sixth laser generators 110 to 160, and the plurality of attenuators 200 may include first to sixth attenuators 210 to 260.

The first attenuator 210 may attenuate the energy intensity of the first laser beam L1 of the first laser generator 110, and the sixth attenuator 260 may attenuate the energy intensity of the first laser beam L1 of the sixth laser generator 160. Accordingly, each of the first and sixth attenuators 210 and 260 may output the second laser beam L2a having reduced energy intensity.

Each of the second to fifth attenuators 220 to 250 may maintain the energy intensity of the corresponding first laser beam L1. Accordingly, each of the second to fifth attenuators 220 to 250 may output the second laser beam L2b having maintained energy intensity.

The optical module 300 may output a line beam L3 by overlapping the second laser beams L2 output from the plurality of attenuators 200. The optical module 300 may generate the line beam L3 by overlapping the plurality of second laser beams L2a incident from the first and sixth attenuators 210 and 260 and the plurality of second laser beams L2b incident from the second to fifth attenuators 220 to 250. Here, in the plurality of second laser beams L2b incident from the second to fifth attenuators 220 to 250, the energy intensity of each of the P-polarized light and S-polarized light of the first laser beam L1 may be maintained. Accordingly, the laser crystallization apparatus 10 may minimize asymmetric reflections of P-polarized light and S-polarized light of the second laser beam L2 output from the plurality of attenuators 200.

The laser crystallization apparatus 10 includes first and sixth attenuators 210 and 260 that attenuate the energy intensity of the first laser beam L1, and second to fifth attenuators 220 to 250 that maintain the energy intensity of the first laser beam L1. The line beam L3 output from the optical module 300 may be provided by overlapping a third laser beam L3a corresponding to the second laser beam L2a with a third laser beam L3b corresponding to the second laser beam L2b. Since the energy intensity of the second laser beam L2b is greater than the energy intensity of the second laser beam L2a, the ratio of the third laser beam L3b in the energy intensity of the line beam L3 may be greater than the ratio of the third laser beam L3a in the energy intensity of the line beam L3. Therefore, the long axis angular distribution of the line beam L3 may be relatively reduced, and the crystallization margin and crystallization uniformity of the laser crystallization apparatus 10 may be improved. In an embodiment, the long axis angular distribution of the line beam L3 of the laser crystallization apparatus 10 including the first to sixth attenuators 210 to 260 may be about 51 milliradians (mrad), for example, but is not limited thereto.

As a result, the laser crystallization apparatus 10 may form polysilicon crystal particles having a uniform size, and thin film transistors including polysilicon have uniform characteristics, thereby improving the image quality of a display device.

Figure 7:
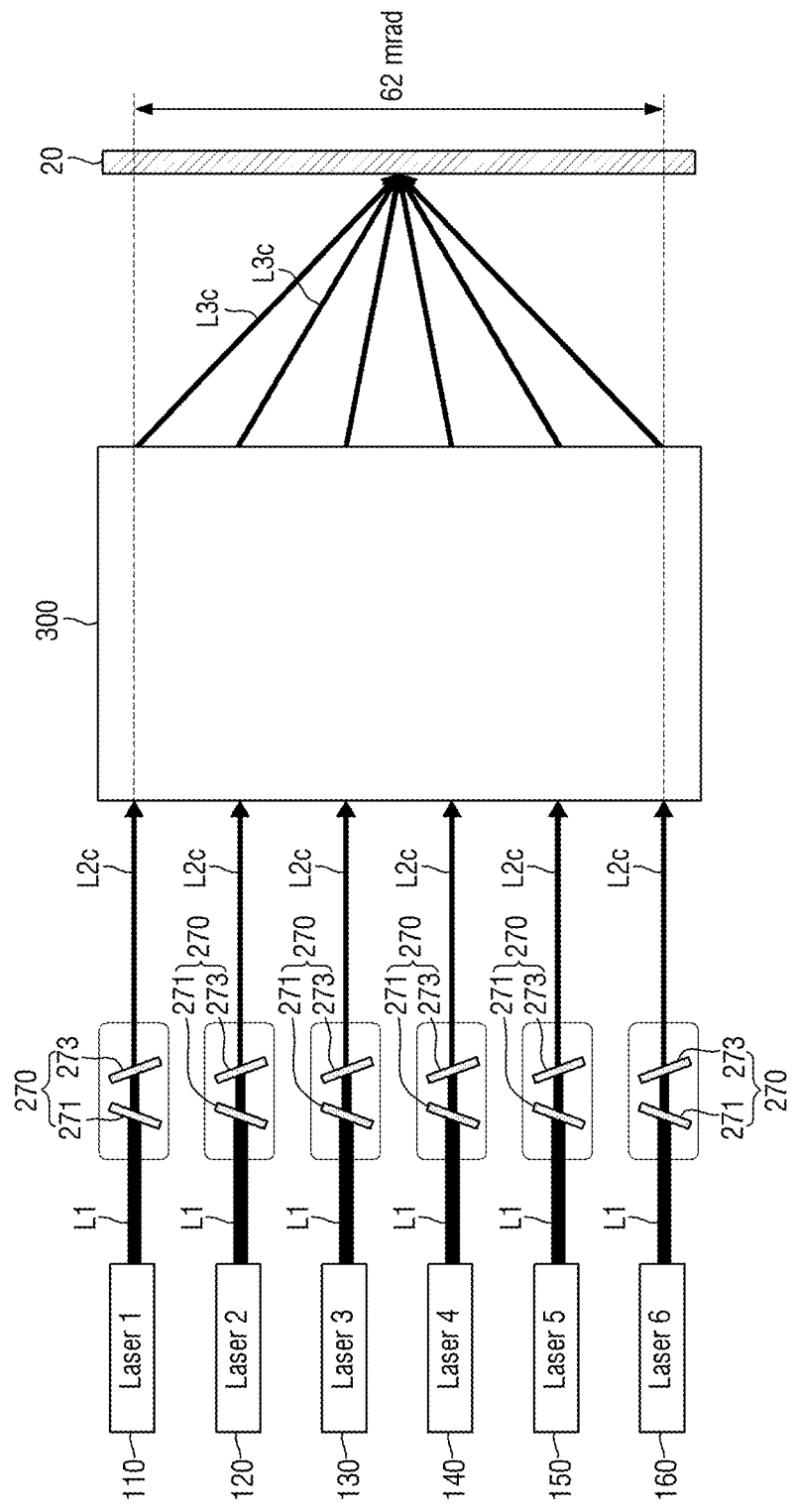
FIG. 7 is a view showing another embodiment of an output of a laser crystallization apparatus.

FIG. 7 is a view showing another embodiment of an output of a laser crystallization apparatus. Here, the laser crystallization apparatus of FIG. 7 may include a plurality of seventh attenuators 270 different from the first to sixth attenuators 210 to 260 shown in FIG. 6.

Referring to FIG. 7, the laser crystallization apparatus may include first to sixth laser generators 110 to 160 and six seventh attenuators 270.

Each of the seventh attenuators 270 may include a first attenuation unit 271 and a second attenuation unit 273. The first and second attenuation units 271 and 273 may be arranged in parallel along the traveling direction of the first laser beam L1, and may transmit and reflect the first laser beam L1. The first attenuation unit 271 may be inclined at a predetermined angle from the traveling direction of the first laser beam L1. The first attenuation unit 271 may transmit a part of the first laser beam L1 and reflect another part of the first laser beam L1. One surface of the first attenuation unit 271 may be inclined at a predetermined angle from the traveling direction of the first laser beam L1, thereby controlling the amount of transmission of the first laser beam L1.

The second attenuation unit 273 may compensate for a path of the laser beam output from the first attenuation unit 271. The second attenuation unit 273 may be inclined at a predetermined angle in a direction opposite to the first attenuation unit 271 from the traveling direction of the first laser beam L1. The inclination of the second attenuation unit 273 may be changed in response to a change in the inclination of the first attenuation unit 271. Accordingly, the second attenuation unit 273 may compensate for the path of the laser beam output from the first attenuation unit 271, so that the second laser beam L2c output from the second attenuation unit 273 may maintain the traveling direction of the first laser beam L1 incident on the first attenuation unit 271.

The optical module 300 may generate the line beam L3 by overlapping the second laser beams L2c incident from the seventh attenuators 270. The line beam L3 output from the optical module 300 may be provided by overlapping a third laser beam L3c. Here, the seventh attenuator 270 may reduce each of the P-polarized light and S-polarized light of the corresponding first laser beam L1. In an embodiment, the long axis angular distribution of the line beam L3 of the laser crystallization apparatus 10 including the six seventh attenuators 270 may be about 62 mrad, for example, but is not limited thereto.

Referring to FIG. 6 together with FIG. 7, the laser crystallization apparatus of FIG. 7 may include six seventh attenuators 270, and the laser crystallization apparatus 10 of FIG. 6 may include first to sixth attenuators 210 to 260. In this case, the long axis angular distribution of the line beam L3 of the laser crystallization apparatus 10 of FIG. 6 may be about 51 mrad, and the long-axis angular distribution of the laser crystallization apparatus of FIG. 7 may be about 62 mrad. Therefore, the laser crystallization apparatus 10 of FIG. 6 may include the first and sixth attenuators 210 and 260 that attenuate the energy intensity of the first laser beam L1, and the second to fifth attenuators 220 to 250 that maintain the energy intensity of the first laser beam L1, thereby relatively reducing the long axis angular distribution of the line beam L3. This laser crystallization apparatus 10 may form polysilicon crystal particles having a uniform size by improving crystallization margin and crystallization uniformity.

Figure 8:
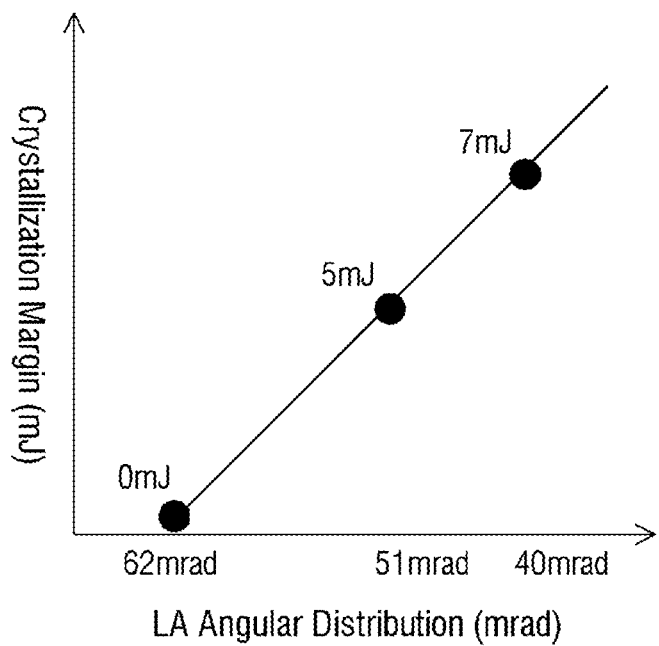
FIG. 8 is a graph showing an embodiment of a crystallization margin with respect to a long axis angular distribution in the laser crystallization apparatus.
Figure 9:
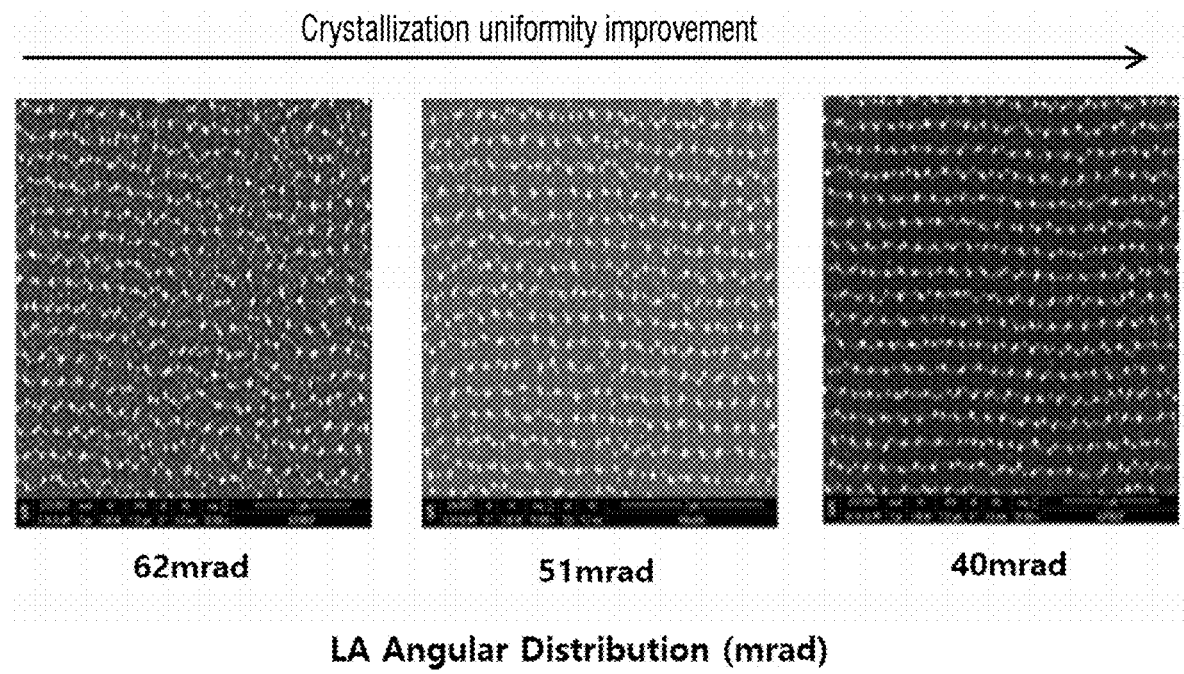
FIG. 9 is a graph showing crystallization an embodiment of uniformity with respect to a long axis angular distribution in the laser crystallization apparatus.

FIG. 8 is a graph showing an embodiment of a crystallization margin with respect to a long axis angular distribution in the laser crystallization apparatus, and FIG. 9 is a graph showing crystallization an embodiment of uniformity with respect to a long axis angular distribution in the laser crystallization apparatus.

Referring to FIGS. 8 and 9, the crystallization margin of the laser crystallization apparatus 10 may be determined by the long axis angular distribution of the line beam L3. In an embodiment, when the long axis angular distribution of the line beam L3 is about 62 mrad, the crystallization margin of the laser crystallization apparatus 10 may be about 0 millijoule (mJ), for example. When the long axis angular distribution of the line beam L3 is about 51 mrad, the crystallization margin of the laser crystallization apparatus 10 may be about 5 mJ. When the long axis angular distribution of the line beam L3 is about 40 mrad, the crystallization margin of the laser crystallization apparatus 10 may be about 7 mJ. Therefore, as the long axis angular distribution of the line beam L3 decreases, the crystallization margin of the laser crystallization apparatus 10 may increase.

Referring to FIGS. 6 and 7 together with FIGS. 8 and 9, since the long axis angular distribution of the laser crystallization apparatus 10 of FIG. 6 is lower than that of the laser crystallization apparatus of FIG. 7, the crystallization margin of the laser crystallization apparatus 10 of FIG. 6 may be higher than that of the laser crystallization apparatus of FIG. 7. Therefore, the crystallization uniformity of the laser crystallization apparatus 10 of FIG. 6 may be improved than that of the laser crystallization apparatus of FIG. 7.

Figure 10:
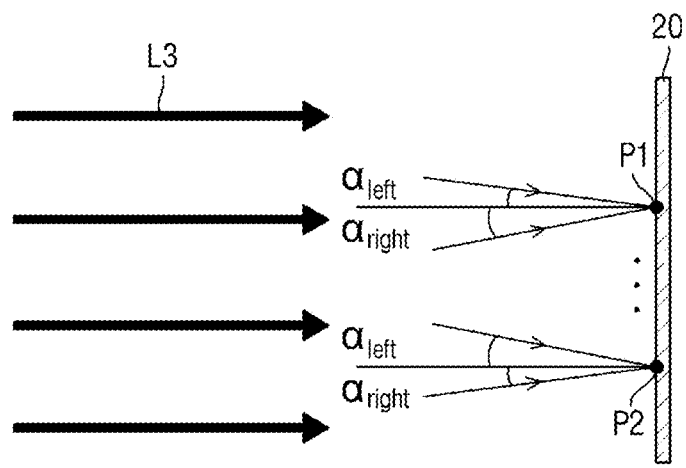
FIG. 10 is a view explaining an embodiment of a long axis angular distribution according to the output of the laser crystallization apparatus.
Figure 11:
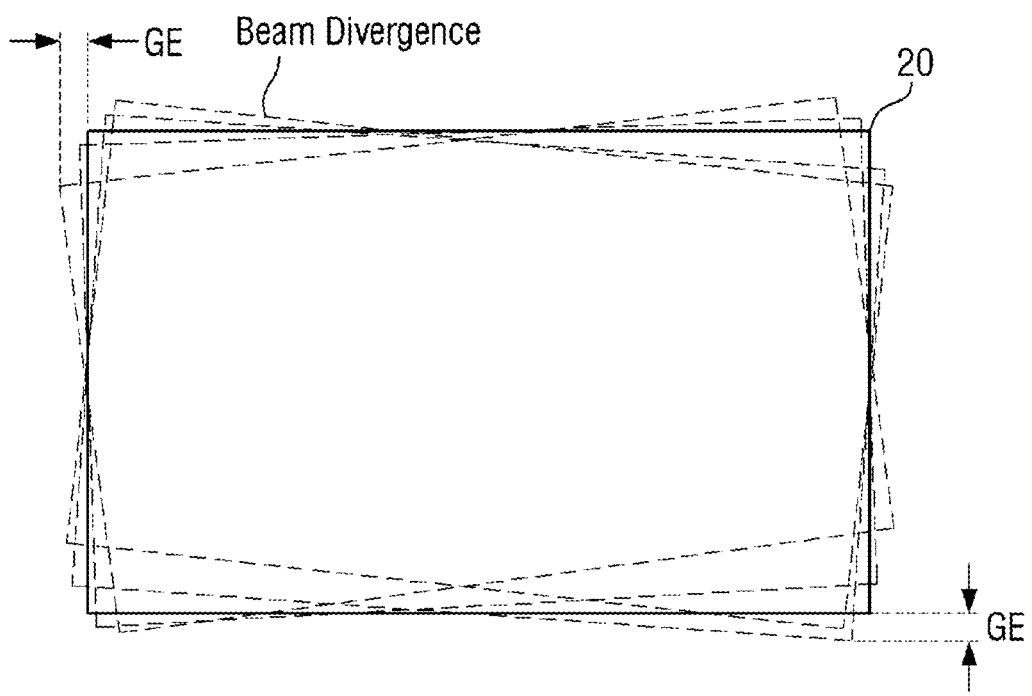
FIG. 11 is a view showing an embodiment of beam divergence according to an output of the laser crystallization apparatus.

FIG. 10 is a view explaining an embodiment of a long axis angular distribution according to the output of the laser crystallization apparatus, and FIG. 11 is a view showing an embodiment of beam divergence according to an output of the laser crystallization apparatus.

Referring to FIGS. 10 and 11, the laser crystallization apparatus 10 including the first to sixth attenuators 210 to 260 (refer to FIGS. 2, 3 and 6) may output the line beam L3 to crystallize an amorphous silicon layer disposed on the substrate 20.

The line beam L3 output from the optical module 300 (refer to FIGS. 2 and 6) may be provided by overlapping a third laser beam L3a (refer to FIG. 6) corresponding to the second laser beam L2a with a third laser beam L3b (refer to FIG. 6) corresponding to the second laser beam L2b. Since the energy intensity of the second laser beam L2b is greater than the energy intensity of the second laser beam L2a, the ratio of the third laser beam L3b in the energy intensity of the line beam L3 may be greater than the ratio of the third laser beam L3a in the energy intensity of the line beam L3. Here, the long axis angular distribution of the line beam L3 may correspond to distribution of incident angles $\alpha_{left}$ and $\alpha_{right}$ of the line beam L3 incident on a plurality of points including the first point P1 and the second point P2 on the substrate 20. The laser crystallization apparatus 10 may improve the crystallization margin and crystallization uniformity by reducing the long-axis angular distribution of the line beam L3.

The laser crystallization apparatus 10 may minimize the beam divergence of the line beam L3 by reducing the long axis angular distribution of the line beam L3. Referring to FIGS. 6 and 7 together with FIG. 11, since the long axis angle distribution of the laser crystallization apparatus 10 of FIG. 6 is lower than the long axis angle distribution of the laser crystallization apparatus of FIG. 7, the beam divergence of the laser crystallization apparatus 10 of FIG. 6 may be lower than the beam divergence of the laser crystallization apparatus of FIG. 7. The laser crystallization apparatus 10 of FIG. 6 may minimize an error GE between the diverged beam and the substrate 20 by minimizing the long axis angular distribution.

Figure 12:
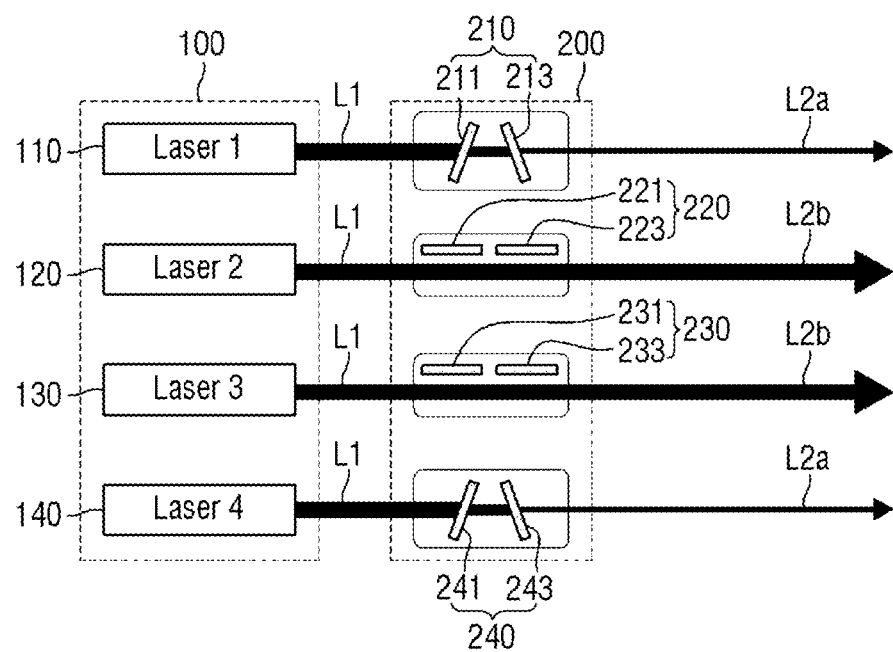
FIG. 12 is a view showing another embodiment of a laser generator and an attenuator of a laser crystallization apparatus.

FIG. 12 is a view showing another embodiment of a laser generator and an attenuator of a laser crystallization apparatus.

Referring to FIG. 12, the plurality of laser generators 100 may include first to fourth laser generators 110 to 140, and the plurality of attenuators 200 may include first to fourth attenuators 210 to 240. The first to fourth laser generators 110 to 140 may correspond to the first to fourth attenuators 210 to 240, respectively, and may supply laser beams L1 to the first to fourth attenuators 210 to 240, respectively. Each of the first to fourth attenuators 210 to 240 may attenuate or maintain the energy intensity of the first laser beam L1 to supply the second laser beam L2 to the optical module 300.

The first attenuator 210 may attenuate the energy intensity of the first laser beam L1 of the first laser generator 110 to supply a second laser beam L2a to the optical module 300. The first attenuator 210 may attenuate the energy intensity of each of the P-polarized light and S-polarized light of the first laser beam L1 to output a second laser beam L2a. The energy intensity of the second laser beam L2a may be smaller than the energy intensity of the first laser beam L1.

The first attenuator 210 may include a first attenuation unit 211 and a second attenuation unit 213. The first and second attenuation units 211 and 213 may be arranged in parallel along the traveling direction of the first laser beam L1, and may transmit and reflect the first laser beam L1. The first attenuation unit 211 may be inclined at a predetermined angle from the traveling direction of the first laser beam L1. The first attenuation unit 211 may transmit a part of the first laser beam L1 and reflect another part of the first laser beam L1. The transmittance and reflectance of the first attenuation unit 211 may be controlled depending on the incident angle of the first laser beam L1. The output of the first attenuation unit 211 may be supplied to the second attenuation unit 213.

The second attenuation unit 213 may compensate for a path of the laser beam output from the first attenuation unit 211. The second attenuation unit 213 may be inclined at a predetermined angle in a direction opposite to the first attenuation unit 211 from the traveling direction of the first laser beam L1. The inclination of the second attenuation unit 213 may be changed in response to a change in the inclination of the first attenuation unit 211. Accordingly, the second attenuation unit 213 may compensate for the path of the laser beam output from the first attenuation unit 211, so that the second laser beam L2a output from the second attenuation unit 213 may maintain the traveling direction of the first laser beam L1 incident on the first attenuation unit 211.

The second attenuator 220 may maintain the energy intensity of the first laser beam L1 of the second laser generator 120 to supply a second laser beam L2b to the optical module 300. The second attenuator 220 may maintain the energy intensity of each of the P-polarized light and S-polarized light of the first laser beam L1 to output the second laser beam L2b.

The second attenuator 220 may include a first plate 221 and a second plate 223. The first and second plates 221 and 223 may be arranged in parallel along the traveling direction of the first laser beam L1, and may pass the first laser beam L1 as it is. Each of the first and second plates 221 and 223 may be spaced apart from the path of the first laser beam L1 by a predetermined distance. The first laser beam L1 may not pass through the first and second plates 221 and 223, and may maintain the existing energy intensity. Accordingly, the energy intensity of the second laser beam L2b, which is an output of the second attenuator 220, may be substantially the same as the energy intensity of the first laser beam L1, which is an input of the second attenuator 220.

The third attenuator 230 may include a first plate 231 and a second plate 233. The third attenuator 230 merely differs from the second attenuator 220 in the corresponding laser generator 100, and may have the same configuration as the second attenuator 220. Accordingly, the third attenuator 230 maintains the energy intensity of the first laser beam L1 of each of the third laser generator 130 to supply the second laser beam L2b to the optical module 300. The energy intensity of the second laser beam L2b, which is an output of the third attenuator 230 may be substantially the same as the energy intensity of the first laser beam L1.

The fourth attenuator 240 may include a first attenuation unit 241 and a second attenuation unit 243. The first and fourth attenuators 210 and 240 merely differ from each other in the corresponding laser generator 100, and may have the same configuration as each other. Accordingly, the first and second attenuation units 241 and 243 of the fourth attenuator 240 may reduce the energy intensity of the first laser beam L1 of the fourth laser generator 140 to supply the second laser beam L2a to the optical module 300. The energy intensity of the second laser beam L2a may be smaller than the energy intensity of the first laser beam L1.

In an embodiment, when the second laser beam L2 of each of the first and fourth attenuators 210 and 240 is output from the outermost of the optical module 300, each of the first and fourth attenuators 210 and 240 may attenuate the energy intensity of the corresponding first laser beam L1, for example. Further, when the second laser beam L2 of each of the second and third attenuators 220 and 230 is output from an area excluding the outermost of the optical module 300, each of the second and third attenuators 220 and 230 may maintain the energy intensity of the corresponding first laser beam L1. Accordingly, each of the first and fourth attenuators 210 and 240 may output the second laser beam L2a having reduced energy intensity, and each of the second and third attenuators 220 and 230 may output the second laser beam L2b having maintained energy intensity.

Figure 13:
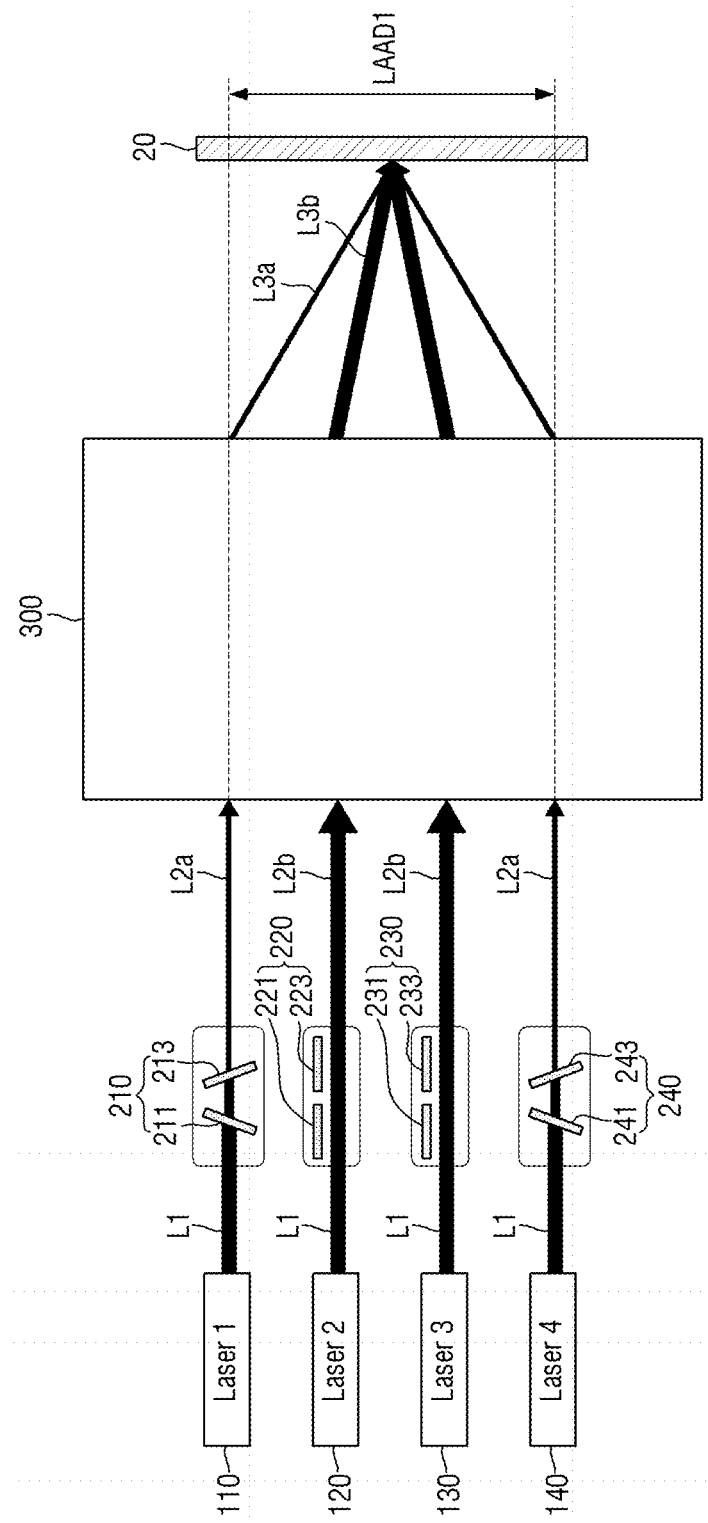
FIG. 13 is a view showing another embodiment of an output of a laser crystallization apparatus.

FIG. 13 is a view showing another embodiment of an output of a laser crystallization apparatus.

Referring to FIG. 13, the plurality of laser generators 100 may include first to fourth laser generators 110 to 140, and the plurality of attenuators 200 may include first to fourth attenuators 210 to 240.

The first attenuator 210 may attenuate the energy intensity of the first laser beam L1 of the first laser generator 110, and the fourth attenuator 240 may attenuate the energy intensity of the first laser beam L1 of the fourth laser generator 140. Accordingly, each of the first and fourth attenuators 210 and 240 may output the second laser beam L2a having reduced energy intensity.

Each of the second and third attenuators 220 and 230 may maintain the energy intensity of the corresponding first laser beam L1. Accordingly, each of the second and third attenuators 220 and 230 may output the second laser beam L2b having maintained energy intensity.

The optical module 300 may output a line beam L3 by overlapping the second laser beams L2 output from the plurality of attenuators 200. The optical module 300 may generate the line beam L3 by overlapping the plurality of second laser beams L2a incident from the first and fourth attenuators 210 and 240 and the plurality of second laser beams L2b incident from the second and third attenuators 220 and 230. Here, in the plurality of second laser beams L2b incident from the second and third attenuators 220 and 230, the energy intensity of each of the P-polarized light and S-polarized light of the first laser beam L1 may be maintained. Accordingly, the laser crystallization apparatus 10 may minimize asymmetric reflections of P-polarized light and S-polarized light of the second laser beam L2 output from the plurality of attenuators 200.

The laser crystallization apparatus 10 includes first and fourth attenuators 210 and 240 that attenuate the energy intensity of the first laser beam L1, and second and third attenuators 220 and 230 that maintain the energy intensity of the first laser beam L1. The line beam L3 output from the optical module 300 may be provided by overlapping a third laser beam L3a corresponding to the second laser beam L2a with a third laser beam L3b corresponding to the second laser beam L2b. Since the energy intensity of the second laser beam L2b is greater than the energy intensity of the second laser beam L2a, the ratio of the third laser beam L3b in the energy intensity of the line beam L3 may be greater than the ratio of the third laser beam L3a in the energy intensity of the line beam L3. Therefore, the long axis angular distribution of the line beam L3 may be relatively reduced, and the crystallization margin and crystallization uniformity of the laser crystallization apparatus 10 may be improved.

As a result, the laser crystallization apparatus 10 may form polysilicon crystal particles having a uniform size, and thin film transistors including polysilicon have uniform characteristics, thereby improving the image quality of a display device.

Figure 14:
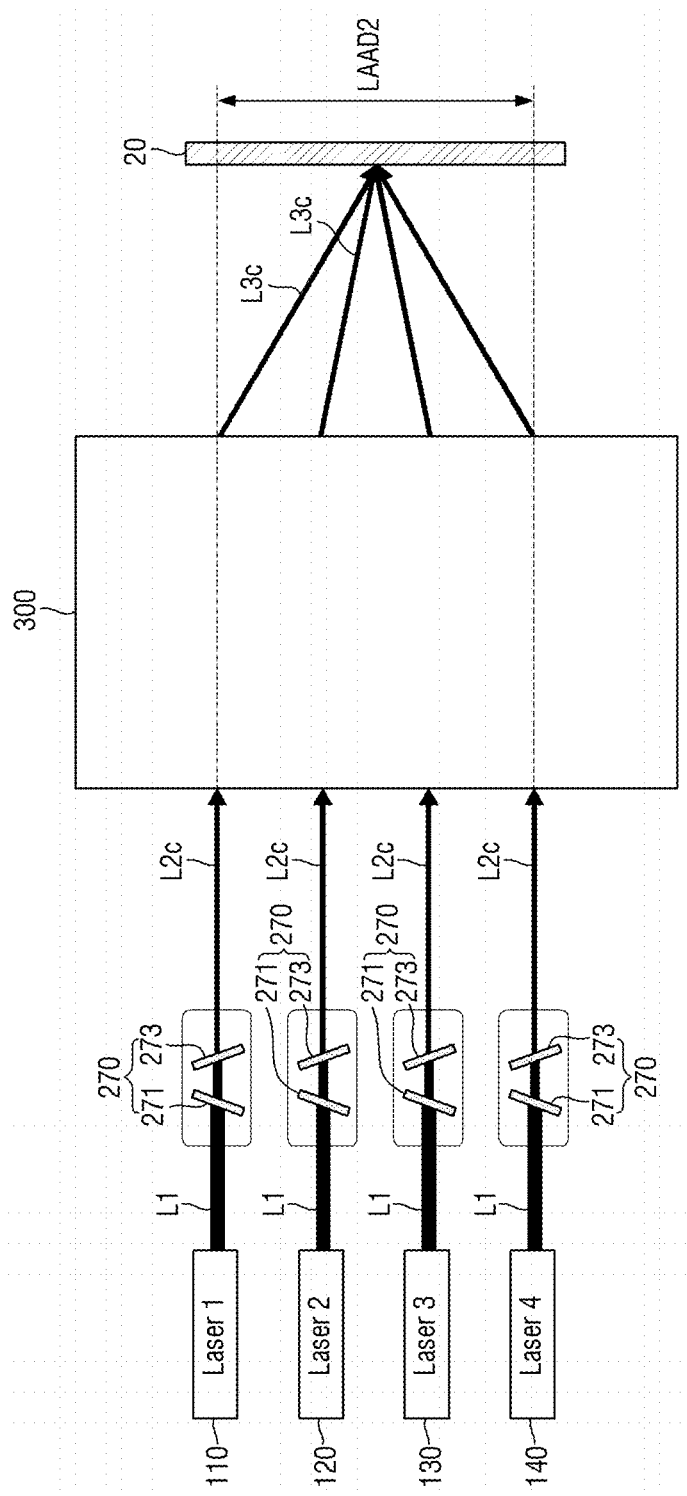
FIG. 14 is a view showing another embodiment of an output of a laser crystallization apparatus.

FIG. 14 is a view showing another embodiment of an output of a laser crystallization apparatus. Here, the laser crystallization apparatus of FIG. 14 may include a plurality of seventh attenuators 270 different from the first to fourth attenuators 210 to 240 shown in FIG. 13.

Referring to FIG. 14, the laser crystallization apparatus may include first to fourth laser generators 110 to 140 and four seventh attenuators 270.

Each of the seventh attenuators 270 may include a first attenuation unit 271 and a second attenuation unit 273. The first and second attenuation units 271 and 273 may be arranged in parallel along the traveling direction of the first laser beam L1, and may transmit and reflect the first laser beam L1. The first attenuation unit 271 may be inclined at a predetermined angle from the traveling direction of the first laser beam L1. The first attenuation unit 271 may transmit a part of the first laser beam L1 and reflect another part of the first laser beam L1. One surface of the first attenuation unit 271 may be inclined at a predetermined angle from the traveling direction of the first laser beam L1, thereby controlling the amount of transmission of the first laser beam L1.

The second attenuation unit 273 may compensate for a path of the laser beam output from the first attenuation unit 271. The second attenuation unit 273 may be inclined at a predetermined angle in a direction opposite to the first attenuation unit 271 from the traveling direction of the first laser beam L1. The inclination of the second attenuation unit 273 may be changed in response to a change in the inclination of the first attenuation unit 271. Accordingly, the second attenuation unit 273 may compensate for the path of the laser beam output from the first attenuation unit 271, so that the second laser beam L2c output from the second attenuation unit 273 may maintain the traveling direction of the first laser beam L1 incident on the first attenuation unit 271.

The optical module 300 may generate the line beam L3 by overlapping the second laser beams L2c incident from the four seventh attenuators 270. Here, the seventh attenuator 270 may reduce each of the P-polarized light and S-polarized light of the corresponding first laser beam L1.

Referring to FIG. 13 together with FIG. 14, the laser crystallization apparatus of FIG. 14 may include four seventh attenuators 270, and the laser crystallization apparatus 10 of FIG. 13 may include first to fourth attenuators 210 to 240. In this case, the long axis angular distribution LAAD1 of the line beam L3 of the laser crystallization apparatus 10 of FIG. 13 may be smaller than the long-axis angular distribution LAAD2 of the laser crystallization apparatus of FIG. 14. Therefore, the laser crystallization apparatus 10 of FIG. 13 may include the first and fourth attenuators 210 and 240 that attenuate the energy intensity of the first laser beam L1, and the second and third attenuators 220 and 230 that maintain the energy intensity of the first laser beam L1, thereby relatively reducing the long axis angular distribution LAAD1 of the line beam L3. This laser crystallization apparatus 10 may form polysilicon crystal particles having a uniform size by improving crystallization margin and crystallization uniformity.

Figure 15:
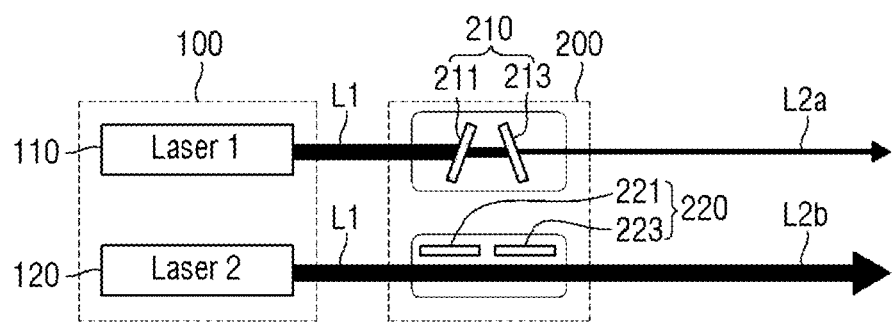
FIG. 15 is a view showing another embodiment of a first attenuator in a laser crystallization apparatus.

FIG. 15 is a view showing another embodiment of a laser generator and an attenuator of a laser crystallization apparatus.

Referring to FIG. 15, the plurality of laser generators 100 may include first and second laser generators 110 and 120, and the plurality of attenuators 200 may include first and second attenuators 210 and 220. The first and second laser generators 110 and 120 may correspond to the first and second attenuators 210 and 220, respectively, and may supply laser beams L1 to the first and second attenuators 210 and 220, respectively. Each of the first and second attenuators 210 and 220 may attenuate or maintain the energy intensity of the first laser beam L1 to supply the second laser beam L2 to the optical module 300.

The first attenuator 210 may attenuate the energy intensity of the first laser beam L1 of the first laser generator 110 to supply a second laser beam L2a to the optical module 300. The first attenuator 210 may attenuate the energy intensity of each of the P-polarized light and S-polarized light of the first laser beam L1 to output a second laser beam L2a. The energy intensity of the second laser beam L2a may be smaller than the energy intensity of the first laser beam L1.

The first attenuator 210 may include a first attenuation unit 211 and a second attenuation unit 213. The first and second attenuation units 211 and 213 may be arranged in parallel along the traveling direction of the first laser beam L1, and may transmit and reflect the first laser beam L1. The first attenuation unit 211 may be inclined at a predetermined angle from the traveling direction of the first laser beam L1. The first attenuation unit 211 may transmit a part of the first laser beam L1 and reflect another part of the first laser beam L1. The transmittance and reflectance of the first attenuation unit 211 may be controlled depending on the incident angle of the first laser beam L1. The output of the first attenuation unit 211 may be supplied to the second attenuation unit 213.

The second attenuation unit 213 may compensate for a path of the laser beam output from the first attenuation unit 211. The second attenuation unit 213 may be inclined at a predetermined angle in a direction opposite to the first attenuation unit 211 from the traveling direction of the first laser beam L1. The inclination of the second attenuation unit 213 may be changed in response to a change in the inclination of the first attenuation unit 211. Accordingly, the second attenuation unit 213 may compensate for the path of the laser beam output from the first attenuation unit 211, so that the second laser beam L2a output from the second attenuation unit 213 may maintain the traveling direction of the first laser beam L1 incident on the first attenuation unit 211.

The second attenuator 220 may maintain the energy intensity of the first laser beam L1 of the second laser generator 120 to supply a second laser beam L2b to the optical module 300. The second attenuator 220 may maintain the energy intensity of each of the P-polarized light and S-polarized light of the first laser beam L1 to output the second laser beam L2b.

The second attenuator 220 may include a first plate 221 and a second plate 223. The first and second plates 221 and 223 may be arranged in parallel along the traveling direction of the first laser beam L1, and may pass the first laser beam L1 as it is. Each of the first and second plates 221 and 223 may be spaced apart from the path of the first laser beam L1 by a predetermined distance. The first laser beam L1 may not pass through the first and second plates 221 and 223, and may maintain the existing energy intensity. Accordingly, the energy intensity of the second laser beam L2b, which is an output of the second attenuator 220, may be substantially the same as the energy intensity of the first laser beam L1, which is an input of the second attenuator 220.

In an embodiment, the first attenuator 210 may attenuate the energy intensity of the corresponding first laser beam L1, and the second attenuator 220 may maintain the energy intensity of the corresponding first laser beam L1, for example. Accordingly, the first attenuator 210 may output the second laser beam L2a having reduced energy intensity, and the second attenuator 220 may output the second laser beam L2b having maintained energy intensity.

Figure 16:
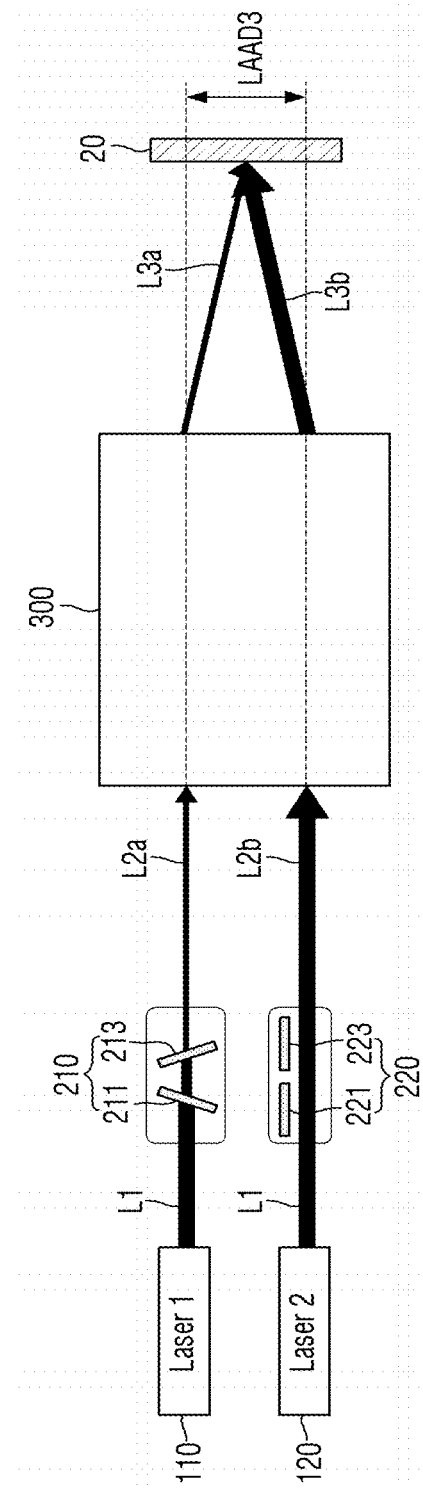
FIG. 16 is a view showing another embodiment of an output of a laser crystallization apparatus.

FIG. 16 is a view showing another embodiment of an output of a laser crystallization apparatus.

Referring to FIG. 16, the plurality of laser generators 100 may include first and second laser generators 110 and 120, and the plurality of attenuators 200 may include first and second attenuators 210 and 220.

The first attenuator 210 may attenuate the energy intensity of the first laser beam L1 of the first laser generator 110. Accordingly, the first attenuator 210 may output the second laser beam L2a having reduced energy intensity.

The second attenuator 220 may maintain the energy intensity of the corresponding first laser beam L1. Accordingly, the second attenuator 220 may output the second laser beam L2b having maintained energy intensity.

The optical module 300 may output a line beam L3 by overlapping the second laser beams L2 output from the plurality of attenuators 200. The optical module 300 may generate the line beam L3 by overlapping the second laser beams L2a incident from the first attenuator 210 and the second laser beams L2b incident from the second attenuators 220. Here, in the second laser beam L2b incident from the second attenuator 220, the energy intensity of each of the P-polarized light and S-polarized light of the first laser beam L1 may be maintained. Accordingly, the laser crystallization apparatus 10 may minimize asymmetric reflections of P-polarized light and S-polarized light of the second laser beam L2 output from the plurality of attenuators 200.

The laser crystallization apparatus 10 includes a first attenuator 210 that attenuates the energy intensity of the first laser beam L1, and a second attenuator 220 that maintains the energy intensity of the first laser beam L1. The line beam L3 output from the optical module 300 may be provided by overlapping a third laser beam L3a corresponding to the second laser beam L2a with a third laser beam L3b corresponding to the second laser beam L2b. Since the energy intensity of the second laser beam L2b is greater than the energy intensity of the second laser beam L2a, the ratio of the third laser beam L3b in the energy intensity of the line beam L3 may be greater than the ratio of the third laser beam L3a in the energy intensity of the line beam L3. Therefore, the long axis angular distribution LAAD3 of the line beam L3 may be relatively reduced, and the crystallization margin and crystallization uniformity of the laser crystallization apparatus 10 may be improved.

As a result, the laser crystallization apparatus 10 may form polysilicon crystal particles having a uniform size, and thin film transistors including polysilicon have uniform characteristics, thereby improving the image quality of a display device.

Figure 17:
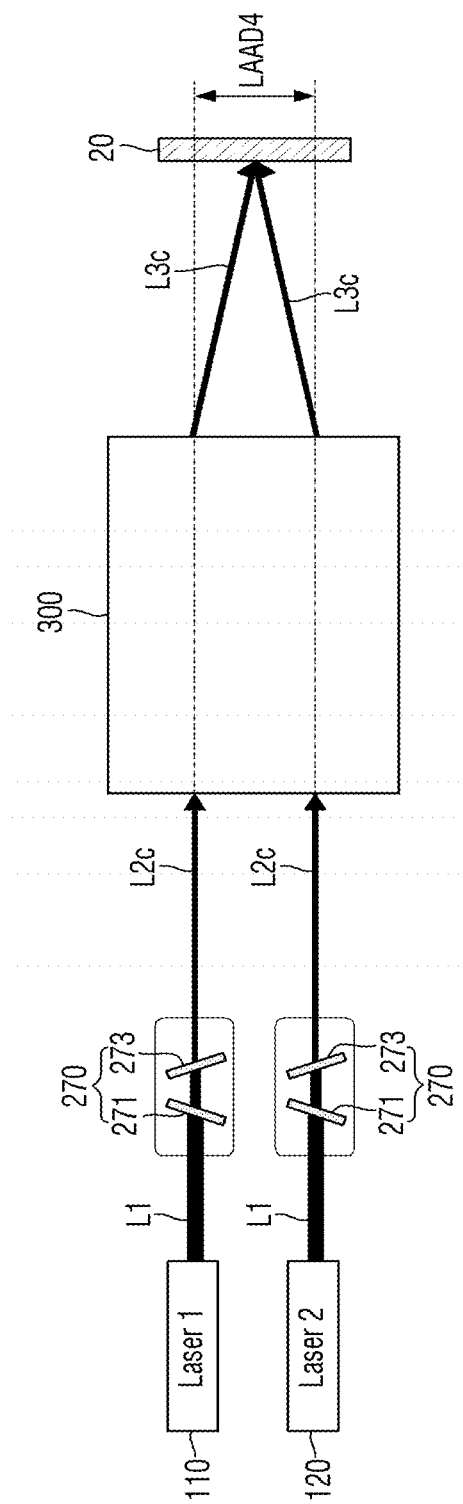
FIG. 17 is a view showing another embodiment of an output of a laser crystallization apparatus.

FIG. 17 is a view showing another embodiment of an output of a laser crystallization apparatus. Here, the laser crystallization apparatus of FIG. 17 may include a plurality of seventh attenuators 270 different from the first and second attenuators 210 and 220 shown in FIG. 16.

Referring to FIG. 17, the laser crystallization apparatus may include first and second laser generators 110 and 120 and two seventh attenuators 270.

Each of the seventh attenuators 270 may include a first attenuation unit 271 and a second attenuation unit 273. The first and second attenuation units 271 and 273 may be arranged in parallel along the traveling direction of the first laser beam L1, and may transmit and reflect the first laser beam L1. The first attenuation unit 271 may be inclined at a predetermined angle from the traveling direction of the first laser beam L1. The first attenuation unit 271 may transmit a part of the first laser beam L1 and reflect another part of the first laser beam L1. One surface of the first attenuation unit 271 may be inclined at a predetermined angle from the traveling direction of the first laser beam L1, thereby controlling the amount of transmission of the first laser beam L1.

The second attenuation unit 273 may compensate for a path of the laser beam output from the first attenuation unit 271. The second attenuation unit 273 may be inclined at a predetermined angle in a direction opposite to the first attenuation unit 271 from the traveling direction of the first laser beam L1. The inclination of the second attenuation unit 273 may be changed in response to a change in the inclination of the first attenuation unit 271. Accordingly, the second attenuation unit 273 may compensate for the path of the laser beam output from the first attenuation unit 271, so that the second laser beam L2c output from the second attenuation unit 273 may maintain the traveling direction of the first laser beam L1 incident on the first attenuation unit 271.

The optical module 300 may generate the line beam L3 by overlapping the second laser beams L2c incident from the two seventh attenuators 270. Here, the seventh attenuator 270 may reduce each of the P-polarized light and S-polarized light of the corresponding first laser beam L1.

Referring to FIG. 16 together with FIG. 17, the laser crystallization apparatus of FIG. 17 may include two seventh attenuators 270, and the laser crystallization apparatus of FIG. 16 may include first and second attenuators 210 and 220. In this case, the long axis angular distribution LAAD3 of the line beam L3 of the laser crystallization apparatus 10 of FIG. 16 may be smaller than the long-axis angular distribution LAAD4 of the laser crystallization apparatus of FIG. 17. Therefore, the laser crystallization apparatus 10 of FIG. 16 may include the first attenuator 210 that attenuates the energy intensity of the first laser beam L1, and the second attenuator 220 that maintains the energy intensity of the first laser beam L1, thereby relatively reducing the long axis angular distribution LAAD3 of the line beam L3. This laser crystallization apparatus 10 may form polysilicon crystal particles having a uniform size by improving crystallization margin and crystallization uniformity.

Figure 18:
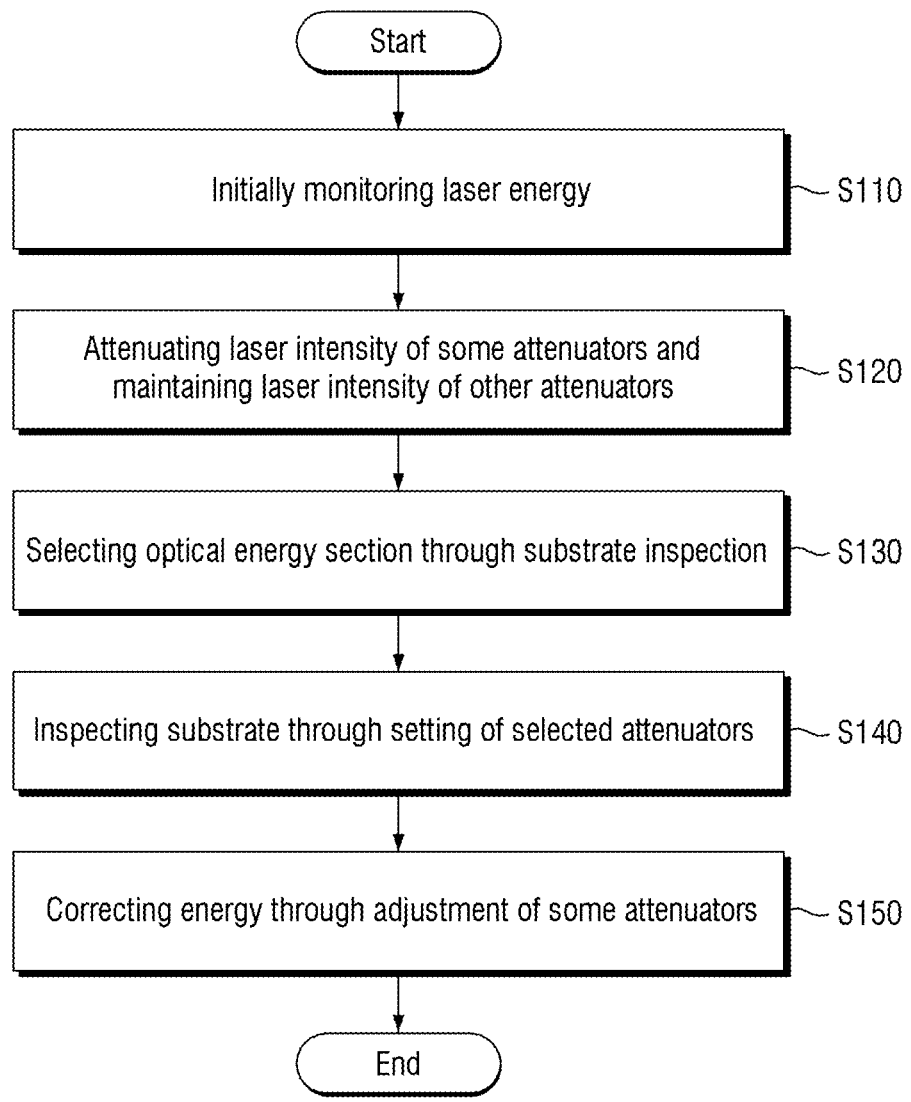
FIG. 18 is a flowchart showing an embodiment of a laser crystallization process of the laser crystallization apparatus.

FIG. 18 is a flowchart showing an embodiment of a laser crystallization process of the laser crystallization apparatus.

Referring to FIG. 18, the laser crystallization apparatus 10 may initially monitor the energy of the line beam L3 (operation S110). In an embodiment, the laser crystallization apparatus 10 may sequentially adjust the energy intensity of the line beam L3 according to a plurality of operations, for example.

Some of the plurality of attenuators 200 may attenuate the energy intensity of the corresponding first laser beam L1, and others of the plurality of attenuators 200 may maintain the energy intensity of the corresponding first laser beam L1. In an embodiment, when the second laser beam L2 of each of the first and sixth attenuators 210 and 260 is output from the outermost of the optical module 300, each of the first and sixth attenuators 210 and 260 may attenuate the energy intensity of the corresponding first laser beam L1 for each operation, for example. Further, when the second laser beam L2 of each of the second to fifth attenuators 220 to 250 is output in an area excluding the outermost of the optical module 300, each of the second to fifth attenuators 220 to 250 may maintain the energy intensity of the corresponding first laser beam L1 (operation S120). Each of the first and sixth attenuators 210 and 260 may adjust the inclinations of the first attenuation units 211 and 261 and the second attenuation units 213 and 263 through the control unit 290, thereby adjusting the energy intensity of the line beam L3.

The laser crystallization apparatus 10 may select an optimal energy section of the line beam L3 through substrate inspection according to the plurality of operations (operation S130). The laser crystallization apparatus 10 may determine the settings of a plurality of attenuators 200 corresponding to the optimum energy section.

The laser crystallization apparatus 10 may perform crystallization inspection of amorphous silicon on the substrate 20 based on the setting of the selected attenuators 200 (operation S140).

The laser crystallization apparatus 10 may further correct the energy intensity of the line beam L3 by adjusting the setting of each of the first and sixth attenuators 210 and 260 (operation S150).

According to laser crystallization apparatuses of embodiments, some attenuators that attenuate the energy intensity of a laser beam and other attenuators that maintain the energy intensity of the laser beam may be provided, thereby relatively reducing the long axis angular distribution of the line beam. Accordingly, the laser crystallization apparatus may improve crystallization margin and crystallization uniformity, and may form polysilicon crystal particles having a uniform size. As a result, the laser crystallization apparatus may form polysilicon crystal particles having a uniform size, and thin film transistors including polysilicon may have uniform characteristics, thereby improving the image quality of a display device.

Although the preferred embodiments of the invention have been disclosed for illustrative purposes, those skilled in the art will appreciate that various modifications, additions and substitutions are possible.

What is claimed is:

1. A laser crystallization apparatus, comprising:
a plurality of laser generators which generate a plurality of laser beams, the plurality of laser generators including first and second laser generators which respectively generate laser beams;
a plurality of attenuators which adjust energy intensity of the plurality of laser beams, the plurality of attenuators including:
a first attenuator which attenuates the energy intensity of the laser beam directly received from the first laser generator; and
a second attenuator which maintains the energy intensity of the laser beam directly received from the second laser generator; and
an optical module which overlaps outputs of the plurality of attenuators and outputs a line beam,
wherein the energy intensity of the corresponding laser beam directly received from the first laser generator to the first attenuator and the energy intensity of the corresponding laser beam directly received from the second laser generator to the second attenuator are identical to each other.

2. The laser crystallization apparatus of claim 1, wherein the first attenuator comprises a first attenuation unit which transmits a portion of the laser beam and reflects another portion of the laser beam and a second attenuation unit which transmits a portion of the portion of the laser beam and reflects another portion of the portion of the laser beam, and the second attenuator comprises a first plate and a second plate which maintain the energy intensity of the laser beam.

3. The laser crystallization apparatus of claim 2, Wherein the first attenuation unit is inclined at a predetermined angle from a traveling direction of the laser beam, and the second attenuation unit is inclined at a predetermined angle in a direction opposite to the first attenuation unit from the traveling direction of the laser beam.

4. The laser crystallization apparatus of claim 2, wherein the first attenuator further comprises:
a first base unit which supports the first attenuation unit;
a second base unit which supports the second attenuation unit; and
a control unit which is connected to each of the first and second base units and rotates the first and second base units in a first rotation direction or a second rotation direction opposite to the first rotation direction.

5. The laser crystallization apparatus of claim 2, wherein the first and second plates of the second attenuator are arranged in parallel to the traveling direction of the corresponding laser beam, and are spaced apart from a path of the laser beam by a predetermined distance.

6. The laser crystallization apparatus of claim 2, wherein the second attenuator further comprises:
a first base unit which supports the first plate; and
a second base unit which supports the second plate,
wherein the first and second base units of the second attenuator are fixed such that the first and second plates are spaced apart from the laser beam.

7. The laser crystallization apparatus of claim 1, wherein the plurality of laser generators generates laser beams having identical energy intensity.

8. The laser crystallization apparatus of claim 1, wherein the optical module comprises:
at least one mirror which reflects an entirety of the laser beam;
at least one splitter which reflects a part of the laser beam and transmits another part of the laser beam; and
a telescope lens which magnifies the laser beam which is reflected by the at least one mirror or passes the at least one splitter.

9. The laser crystallization apparatus of claim 8, wherein the optical module further comprises:
a homogenizer which equalizes the laser beams which pass through the telescope lens; and
a plurality of cylindrical lenses which adjust intensity and focus of laser beams which pass through the homogenizer to output a line beam.

10. The laser crystallization apparatus of claim 1, wherein the plurality of laser generators further includes third to sixth laser generators,
the plurality of attenuators includes first to sixth attenuators corresponding to each of the first to sixth laser generators, and
the first and sixth attenuators attenuate the energy intensity of the corresponding laser beam, and the second to fifth attenuators maintain the energy intensity of the corresponding laser beam.

11. The laser crystallization apparatus of claim 10, wherein each of the first and sixth attenuators comprises a first attenuation unit which transmits a portion of the laser beam and reflects another portion of the laser beam and a second attenuation unit which transmits a portion of the portion of the laser beam and reflects another portion of the portion of the laser beam, and each of the second to fifth attenuators comprises a first plate and second plate which maintain energy intensity of the laser beam.

12. The laser crystallization apparatus of claim 11, wherein the first attenuation unit is inclined at a predetermined angle from a traveling direction of the laser beam, and the second attenuation unit is inclined at a predetermined angle in a direction opposite to the first attenuation unit from the traveling direction of the laser beam.

13. The laser crystallization apparatus of claim 11, wherein each of the first and second attenuators further comprises:
a first base unit which supports the first attenuation unit;
a second base unit which supports the second attenuation unit; and
a control unit which is connected to the first and second base units and rotates the first and second base units in a first rotation direction or a second rotation direction opposite to the first rotation direction.

14. The laser crystallization apparatus of claim 11, wherein the first and second plates are arranged in parallel to the traveling direction of the corresponding laser beam, and are spaced apart from a path of the laser beam by a predetermined distance.

15. The laser crystallization apparatus of claim 14, wherein each of the second to fifth attenuators further comprises:
a first base unit which supports the first plate; and
a second base unit which supports the second plate, wherein the first and second base units of each of the second to fifth attenuators are fixed such that the first and second plates are spaced apart from the laser beam.

16. The laser crystallization apparatus of claim 1, wherein the plurality of laser generators further includes third to fourth laser generators,
the plurality of attenuators includes first to fourth attenuators corresponding to each of the first to fourth laser generators, and
the first and fourth attenuators attenuate the energy intensity of the corresponding laser beam, and the second and third attenuators maintain the energy intensity of the corresponding laser beam.

17. The laser crystallization apparatus of claim 16, wherein each of the first and fourth attenuators comprises a first attenuation unit which transmits a portion of the laser beam and reflects another portion of the laser beam and a second attenuation unit which transmits portion of the portion of the laser beam and reflects another portion of the portion of the laser beam, and each of the second and third attenuators comprises a first plate and second plate which maintain energy intensity of the laser beam.

18. The laser crystallization apparatus of claim 17, wherein the first attenuation unit is inclined at a predetermined angle from a traveling direction of the laser beam, and the second attenuation unit is inclined at a predetermined angle in a direction opposite to the first attenuation unit from the traveling direction of the laser beam.

19. The laser crystallization apparatus of claim 17, wherein each of the first and fourth attenuators further comprises:
a first base unit which supports the first attenuation unit;
a second base unit which supports the second attenuation unit; and
a control unit which is connected to the first and second base units and rotates the first and second base units in a first rotation direction or a second rotation direction opposite to the first rotation direction.

20. The laser crystallization apparatus of claim 17, wherein the first and second plates of each of the second and third attenuators are arranged in parallel to the traveling direction of the corresponding laser beam, and are spaced apart from a path of the laser beam by a predetermined distance.

* * * * *